United States Patent
Kang et al.

(10) Patent No.: US 10,157,824 B2
(45) Date of Patent: Dec. 18, 2018

(54) INTEGRATED CIRCUIT (IC) PACKAGE AND PACKAGE SUBSTRATE COMPRISING STACKED VIAS

(71) Applicant: QUALCOMM Incorporated, San Diego, CA (US)

(72) Inventors: Kuiwon Kang, San Diego, CA (US); Houssam Jomaa, San Diego, CA (US); Layal Rouhana, San Diego, CA (US); Seongryul Choi, Seongnam (KR)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/678,698

(22) Filed: Aug. 16, 2017

(65) Prior Publication Data
US 2018/0323137 A1   Nov. 8, 2018

Related U.S. Application Data

(60) Provisional application No. 62/502,307, filed on May 5, 2017.

(51) Int. Cl.
| | | |
|---|---|---|
| *H01L 23/538* | (2006.01) | |
| *H01L 23/498* | (2006.01) | |
| *H01L 23/31* | (2006.01) | |
| *H01L 21/56* | (2006.01) | |
| *H01L 21/768* | (2006.01) | |

(52) U.S. Cl.
CPC ...... *H01L 23/49827* (2013.01); *H01L 21/561* (2013.01); *H01L 21/76898* (2013.01); *H01L 23/3128* (2013.01); *H01L 23/49811* (2013.01); *H01L 23/49838* (2013.01); *H01L 23/5384* (2013.01)

(58) Field of Classification Search
CPC .................................................. H01L 21/4814
See application file for complete search history.

(56) References Cited

U.S. PATENT DOCUMENTS

| | | | |
|---|---|---|---|
| 7,393,720 B2 | 7/2008 | Lee et al. | |
| 8,021,931 B2 * | 9/2011 | Filoteo, Jr. | ........ H01L 23/49827 257/738 |
| 8,633,707 B2 | 1/2014 | Filippi et al. | |

(Continued)

FOREIGN PATENT DOCUMENTS

| | | |
|---|---|---|
| JP | 2009065115 A | 3/2009 |
| WO | 2016187593 | 11/2016 |

OTHER PUBLICATIONS

International Search Report and Written Opinion—PCT/US2018/028903—ISA/EPO—Jul. 9, 2018.

*Primary Examiner* — Cheung Lee
(74) *Attorney, Agent, or Firm* — Loza & Loza, LLP/Qualcomm

(57) ABSTRACT

A device comprising a semiconductor die, a package substrate coupled to the semiconductor die, and an encapsulation layer that at least partially encapsulates the semiconductor die. The package substrate includes at least one stacked via. The at least one stacked via includes a first via and a second via coupled to the first via. The second via includes a seed layer coupled to the first via. The second via includes a different shape than the first via. The package substrate includes a prepreg layer. The package substrate includes a first pad coupled to the first via, and a second pad coupled to the second via.

31 Claims, 22 Drawing Sheets

(56) References Cited

U.S. PATENT DOCUMENTS

| | | |
|---|---|---|
| 9,426,891 B2 | 8/2016 | Tsai et al. |
| 9,490,163 B2 | 11/2016 | Huang et al. |
| 2013/0037944 A1 | 2/2013 | Lee et al. |
| 2014/0159249 A1 | 6/2014 | Uzoh |
| 2016/0007460 A1* | 1/2016 | Shimizu ............ H01L 23/49827 361/783 |
| 2016/0071816 A1* | 3/2016 | Huang ................ H01L 25/0655 257/738 |
| 2016/0163578 A1 | 6/2016 | Yu et al. |
| 2016/0315042 A1 | 10/2016 | Yoon et al. |
| 2017/0069575 A1 | 3/2017 | Haba et al. |

\* cited by examiner

INTEGRATED CIRCUIT (IC) PACKAGE AND PACKAGE SUBSTRATE COMPRISING STACKED VIAS

CLAIM OF BENEFIT

This application claims priority to and the benefit of Provisional Application No. 62/502,307 filed on May 5, 2017 in the U.S. Patent and Trademark Office, the entire content of which is incorporated herein by reference.

BACKGROUND

Field

Various features relate to integrated circuit (IC) packages, but more specifically to integrated circuit (IC) packages that include a package substrate comprising stacked vias.

Background

FIG. 1 illustrates an integrated circuit (IC) package 100 coupled to a printed circuit board (PCB) 102 through a plurality of solder interconnects 108. The integrated circuit (IC) package 100 includes a package substrate 102, a die 104, and an encapsulation layer 106.

FIG. 2 illustrates a profile view of a portion of the package substrate 102. The package substrate 102 includes at least one dielectric layer 220, a via 230, a first pad 240, a second pad 250, a first solder resist (SR) layer 260 and a second resist (SR) layer 270. The via 230 travels through the entirety of the at least one dielectric layer 220. The first pad 240 and the second pad 250 are coupled to the via 230. The process of making the package substrate 102 is such that it produces vias (e.g., via 230) with relatively large widths or diameters. The relatively large size of the widths or diameters of the vias limits how small the package substrate 102 can be and how many vias can be formed in the package substrate 102. This, in turn limits the size of devices that include the package substrate 102.

Therefore, there is an ongoing need to reduce the size of devices and packages, and to provide higher density interconnects in devices and packages.

SUMMARY

Various features relate to integrated circuit (IC) packages, but more specifically to integrated circuit (IC) packages that include a package substrate comprising stacked vias.

One example provides a device comprising a semiconductor die, a package substrate coupled to the semiconductor die, and an encapsulation layer that at least partially encapsulates the semiconductor die. The package substrate includes at least one stacked via. The at least one stacked via includes a first via and a second via coupled to the first via. The second via includes a seed layer coupled to the first via. The second via includes a different shape than the first via.

Another example provides an apparatus comprising a semiconductor die, a package substrate coupled to the semiconductor die, and an encapsulation layer that at least partially encapsulates the semiconductor die. The package substrate includes a means for interconnect. The means for interconnect includes a first via and a second via coupled to the first via. The second via includes a seed layer coupled to the first via. The second via includes a different shape than the first via.

Another example provides a method for fabricating a device. The method provides a semiconductor die. The method couples a package substrate to the semiconductor die, the package substrate comprising at least one stacked via, the at least one stacked via comprising: a first via; and a second via coupled to the first via, the second via comprising a different shape than the first via. The second via includes a seed layer coupled to the first via. The method forms an encapsulation layer that at least partially encapsulates the semiconductor die.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a device comprising a semiconductor die, a package substrate coupled to the semiconductor die, and an encapsulation layer that at least partially encapsulates the semiconductor die. The package substrate includes at least one stacked via. The at least one stacked via includes a first via and a second via coupled to the first via. The second via includes a seed layer coupled to the first via. The second via includes a different shape than the first via. The package substrate includes a dielectric layer (e.g., prepreg layer). The package substrate includes a first pad coupled to the first via, and a second pad coupled to the second via.

Figure 1:
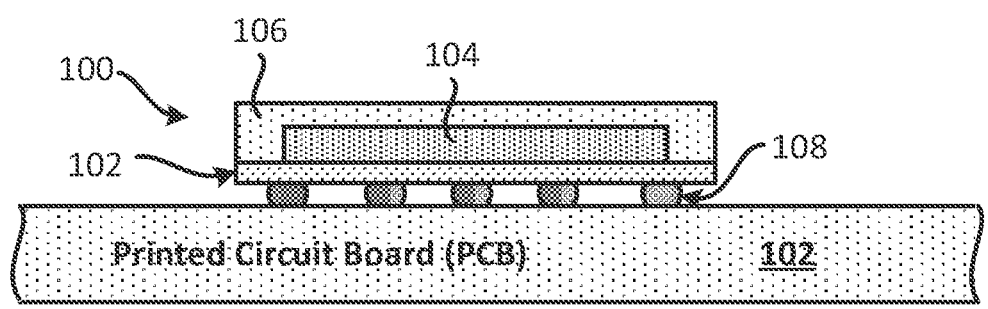
FIG. 1 illustrates an integrated circuit (IC) package that includes a semiconductor die, a package substrate and an encapsulation layer.
Figure 2:
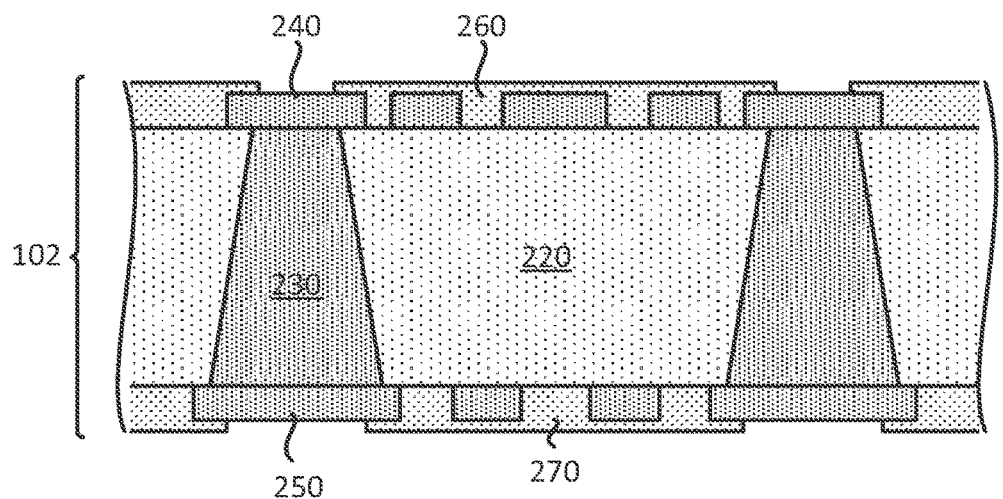
FIG. 2 illustrates a profile view of a package substrate.
Figure 3:
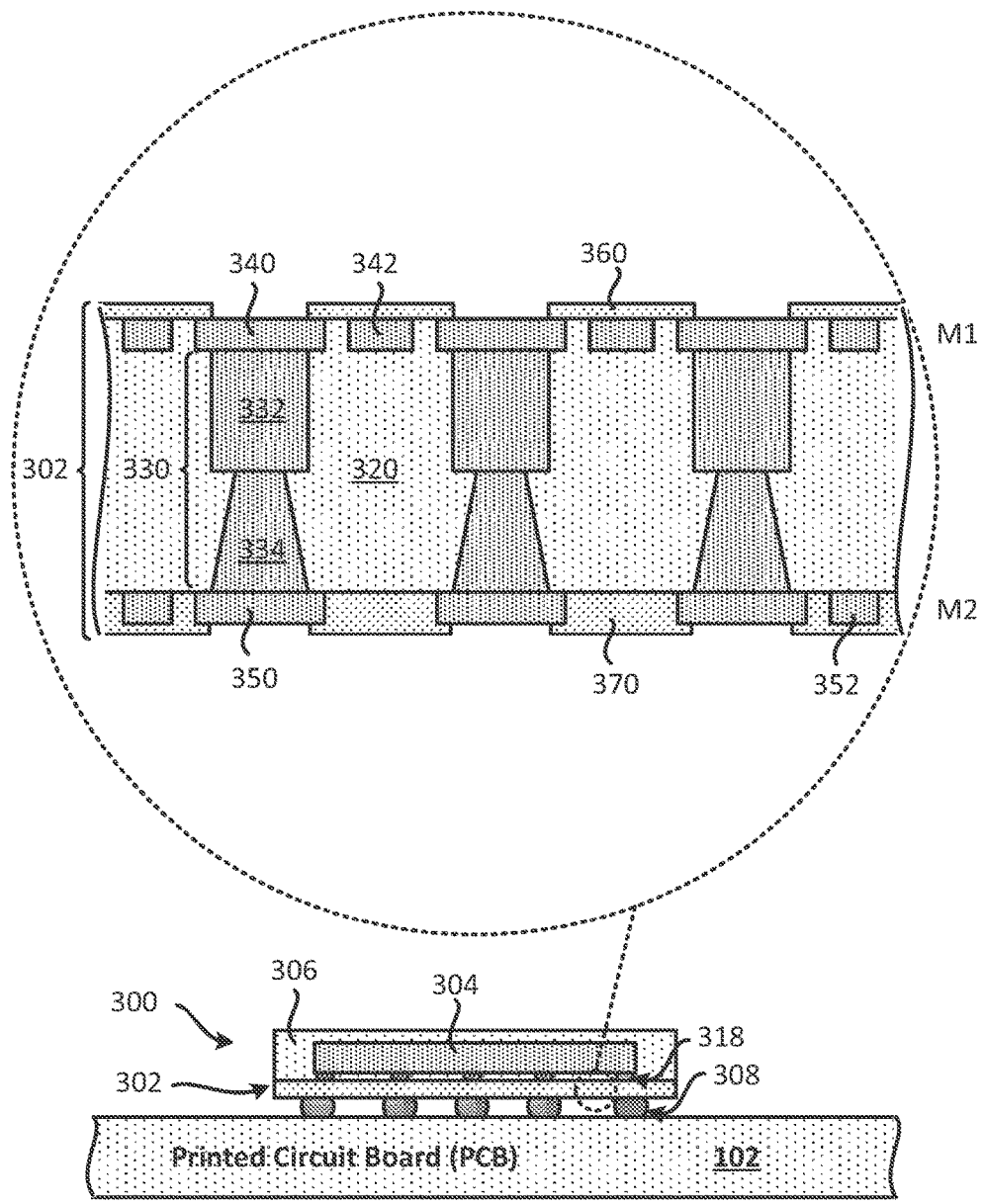
FIG. 3 illustrates an integrated circuit (IC) package that includes a semiconductor die, a package substrate that includes stacked vias, and an encapsulation layer.

Exemplary Integrated Circuit (IC) Package Comprising a Package Substrate that Includes Stacked Vias FIG. 3 illustrates an integrated circuit (IC) package 300 coupled to a printed circuit board (PCB) 102 through a plurality of solder interconnects 308. The integrated circuit (IC) package 300 includes a package substrate 302, a die 304 (e.g., semiconductor die), and an encapsulation layer 306. The die 304 is coupled to the package substrate 302 through a plurality of interconnects 318. The encapsulation layer 306 at least partially encapsulates the die 304.

The package substrate 302 includes at least one stacked via that includes a first via and a second via coupled to the first via. The first via has a first shape and the second via has a second shape. The second via has a different shape than the first via.

As shown in FIG. 3, the package substrate 302 includes at least one dielectric layer 220, at least one stacked via 330, a first pad 340, at least one first interconnect 342, a second pad 350, at least one second interconnect 352, a first solder resist (SR) layer 360 and a second solder resist (SR) layer 370.

The at least one stacked via 330 travels through the at least one dielectric layer 220. A means for interconnect may include the at least one stacked via 330. The at least one stacked via 330 includes a first via 332 and a second via 334. The first via 332 is coupled to the second via 334 to form the at least one stacked via 330. The first via 332 is touching the second via 334. The first via 332 has a different profile shape than a profile shape of the second via 334. In this particular example, the first via 332 has a first profile shape (e.g., vertical profile shape) that is the shape of about a rectangle or about a square, and the second via 334 has a second profile shape (e.g., vertical profile shape) that is the shape of about a cone. However, different implementations may use vias with different profile shapes (e.g., different vertical profile shapes).

The first via 332 has a first surface and a second surface. The second via 334 has a third surface and a fourth surface. The second surface of the first via 332 is coupled to the third surface of the second via 334. The first surface of the first via 332 is coupled to the first pad 340. The fourth surface of the second via 334 is coupled to the second pad 350. The first pad 340 is at least partially embedded in the dielectric layer 320. The second pad 350 is formed over the dielectric layer 320.

As mentioned above, the package substrate 302 includes at least one first interconnect 342 and at least one second interconnect 352. The at least one first interconnect 342 may include a trace and/or a pad. The at least one second interconnect 352 may include a trace and/or a pad. The at least one first interconnect 342 is at least partially embedded in the dielectric layer 320. The at least one second interconnect 352 is formed over the dielectric layer 320. The at least one first interconnect 342 is substantially co-planar to the first pad 340. In some implementations, the at least one first interconnect 342 and the first pad 340 are on a first metal layer (M1) of the package substrate 302. The at least one second interconnect 352 is substantially co-planar to the second pad 350. In some implementations, the at least one second interconnect 352 and the second pad 350 are on a second metal layer (M2) of the package substrate 302.

The first solder resist (SR) layer 360 may cover portions of a first surface of the package substrate 302. For example, the first solder resist (SR) layer 360 may cover the dielectric layer 320, the at least one first interconnect 342 and/or portions of the first pad 340. The second solder resist (SR) layer 370 may cover portions of a second surface of the package substrate 302. For example, the second solder resist (SR) layer 370 may cover the dielectric layer 320, the at least one second interconnect 352 and/or portions of the second pad 350. Different implementations may use different materials for the at least one dielectric layer 320. In some implementations, the at least one dielectric layer 320 includes a prepreg layer.

FIG. 3 illustrates that a first surface of the package substrate 302 faces the die 304, and a second surface of the package substrate 302 faces the printed circuit board (PCB) 102. In some implementations, one or more of the interconnects from the plurality of interconnects 318 is coupled to interconnects (e.g., first pad 340) from the M1 layer. The plurality of interconnects 318 may include pillars and/or solder interconnects. In some implementations, one or more of the interconnects from the plurality of solder interconnects 308 is coupled to interconnects (e.g., second pad 350) from the M2 layer.

In some implementations, the package substrate of an integrated circuit (IC) package may be configured differently.

Figure 4:
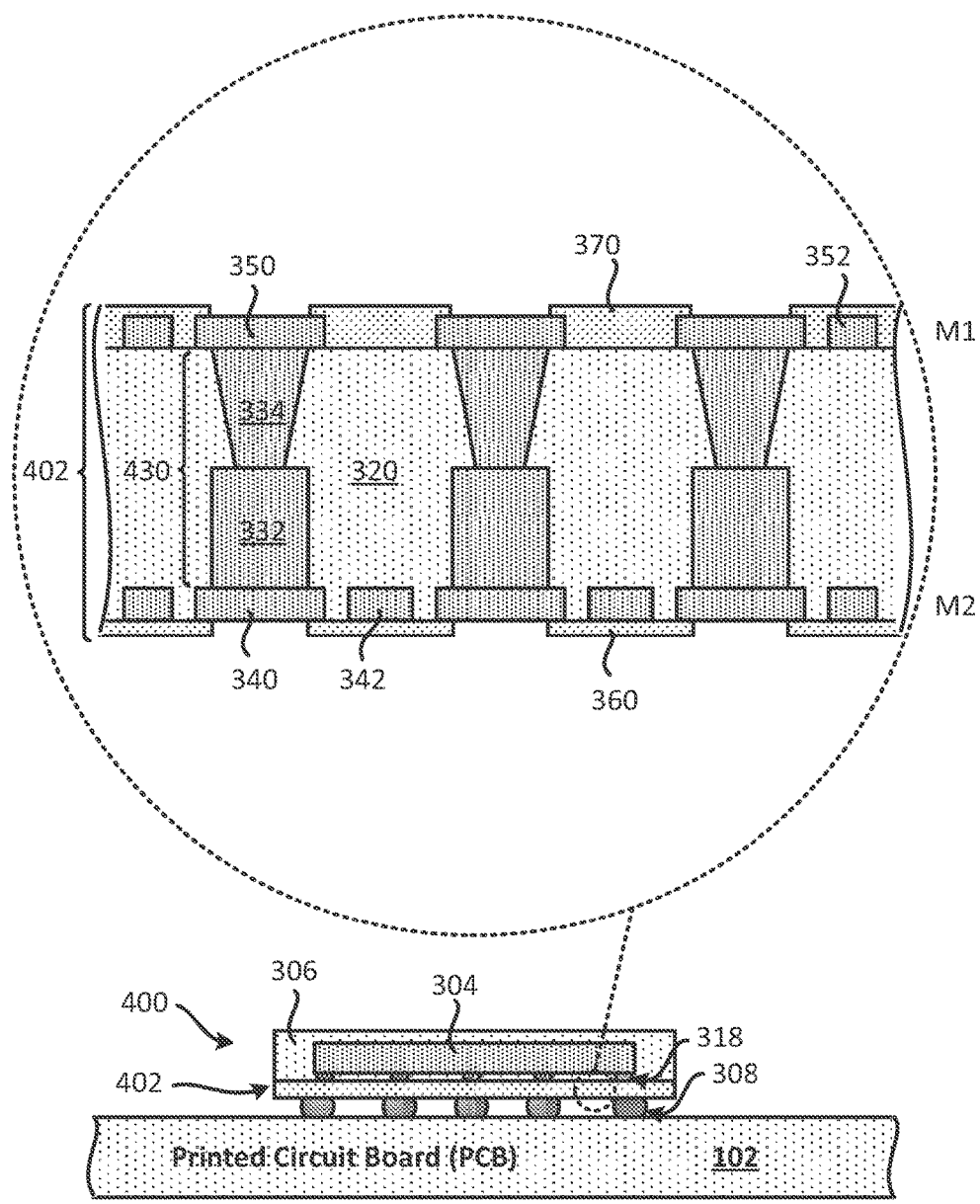
FIG. 4 illustrates an integrated circuit (IC) package that includes a semiconductor die, a package substrate that includes stacked vias, and an encapsulation layer.

FIG. 4 illustrates an integrated circuit (IC) package 400 coupled to the printed circuit board (PCB) 102 through the plurality of solder interconnects 408. The integrated circuit (IC) package 400 includes a package substrate 402, the die 304 (e.g., semiconductor die), and the encapsulation layer 306. The die 304 is coupled to the package substrate 402 through the plurality of interconnects 318. The encapsulation layer 306 at least partially encapsulates the die 304.

The package substrate 402 includes at least one stacked via that includes a first via and a second via coupled to the first via. The first via has a first shape and the second via has a second shape. The second via has a different shape than the first via.

The package substrate 402 of FIG. 4 is similar to the package substrate 302 of FIG. 3. The package substrate 402 includes at least one stacked via 430. The at least one stacked via 430 travels through the at least one dielectric layer 220. The at least one stacked via 430 includes the first via 332 and the second via 334. The first via 332 is coupled to the second via 334 to form the at least one stacked via 430. The first via 332 is touching the second via 334. The first via 332 has a different profile shape than a profile shape of the second via 334. In this particular example, the first via 332 has a first profile shape (e.g., vertical profile shape) that is the shape of about a rectangle or about a square, and the second via 334 has a second profile shape (e.g., vertical profile shape) that is the shape of about a cone. However, different implementations may use vias with different profile shapes (e.g., different vertical profile shapes).

In some implementations, the second pad 350 and the at least one second interconnect 352 are considered part of the first metal layer (M1) of the package substrate 402, and the first pad 340 and the at least one first interconnect 342 are considered part of the second metal layer (M2) of the package substrate 402.

FIG. 4 illustrates that a first surface of the package substrate 402 faces the printed circuit board (PCB) 102, and a second surface of the package substrate 402 faces the die 304. In some implementations, one or more of the interconnects from the plurality of interconnects 318 is coupled to interconnects (e.g., second pad 350) from the M1 layer. The plurality of interconnects 318 may include pillars and/or solder interconnects. In some implementations, one or more of the interconnects from the plurality of solder interconnects 308 is coupled to interconnects (e.g., first pad 340) from the M2 layer.

One of the technical advantages of the above package substrate 302 and/or the package substrate 402 is how tightly and/or densely the interconnects (e.g., stacked vias, pads, traces) can be formed on and/or in the package substrate. For example, by using a stacked via (e.g., 330) that is formed by multiple vias (e.g., two or more vias), an overall via with a smaller width or diameter can be formed in the package substrate 302 and/or the package substrate 402. As mentioned above, other conventional package substrates produce vias with relatively large or wide widths or diameters. This is due to the limitations of the fabrication processes that are used to produce these vias in conventional package substrates. In contrast, the package substrate 302 and/or the package substrate 402 may include stacked vias (e.g., at least one stacked via 330) that have a width or diameter that can be as small as about 70-80 micrometers (μm). The stacked vias may have a height of about 50-80 micrometers (μm). In some implementations, the overall thickness of the package substrate 302 and/or the package substrate 402 may be as small as about 60-100 micrometers (μm). In some implementations, the pads (e.g., first pad 340, second pad 350) may have a width that is as small as about 100-115 micrometers (μm). In some implementations, a plurality of first interconnects (e.g., 342) and/or a plurality of second interconnects (e.g., 352) may include line and spacing (L/S) in a range of about 5/5 micrometers (μm) and about 12/12 micrometers (μm). That is, the line (L) of interconnects may be about 5-12 micrometers (μm), and the spacing of interconnects may be about 5-12 micrometers (μm). The line (L) of an interconnect may be referred to as the width of the interconnect, and the spacing (S) of an interconnect may be referred to as a spacing between two adjacent interconnects. In some implementations, the above dimensions are made possible through the fabrication processes that are described in the present disclosure.

An interconnect is an element or component of a device (e.g., integrated circuit (IC) package, integrated circuit (IC) device, die) and/or a base (e.g., device package base, package substrate, printed circuit board (PCB), interposer) that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect includes an electrically conductive material that provides an electrical path for a signal (e.g., data signal, ground signal, power signal). An interconnect may include more than one interconnect. An interconnect may include one or more metals (e.g., copper, aluminum, nickel, etc . . . ).

Having described various package substrates that include stacked vias, an exemplary sequence for fabricating such a package substrate that includes stacked vias will now be described below.

Exemplary Sequence for Fabricating a Package Substrate that Includes Stacked Vias In some implementations, fabricating a package substrate that includes stacked vias includes several processes. FIG. 5 (which includes FIGS. 5A-5D) illustrates an exemplary sequence for providing or fabricating a package substrate that includes stacked vias. In some implementations, the sequence of FIGS. 5A-5D may be used to provide or fabricate the package substrate of FIGS. 3, 4 and/or other package substrate described in the present disclosure.

It should be noted that the sequence of FIGS. 5A-5D may combine one or more stages in order to simplify and/or clarify the sequence for providing or fabricating a package substrate that includes stacked vias. In some implementations, the order of the processes may be changed or modified. In some implementations, one or more of processes may be replaced or substituted with departing from the spirit of the disclosure.

Figure 5A:
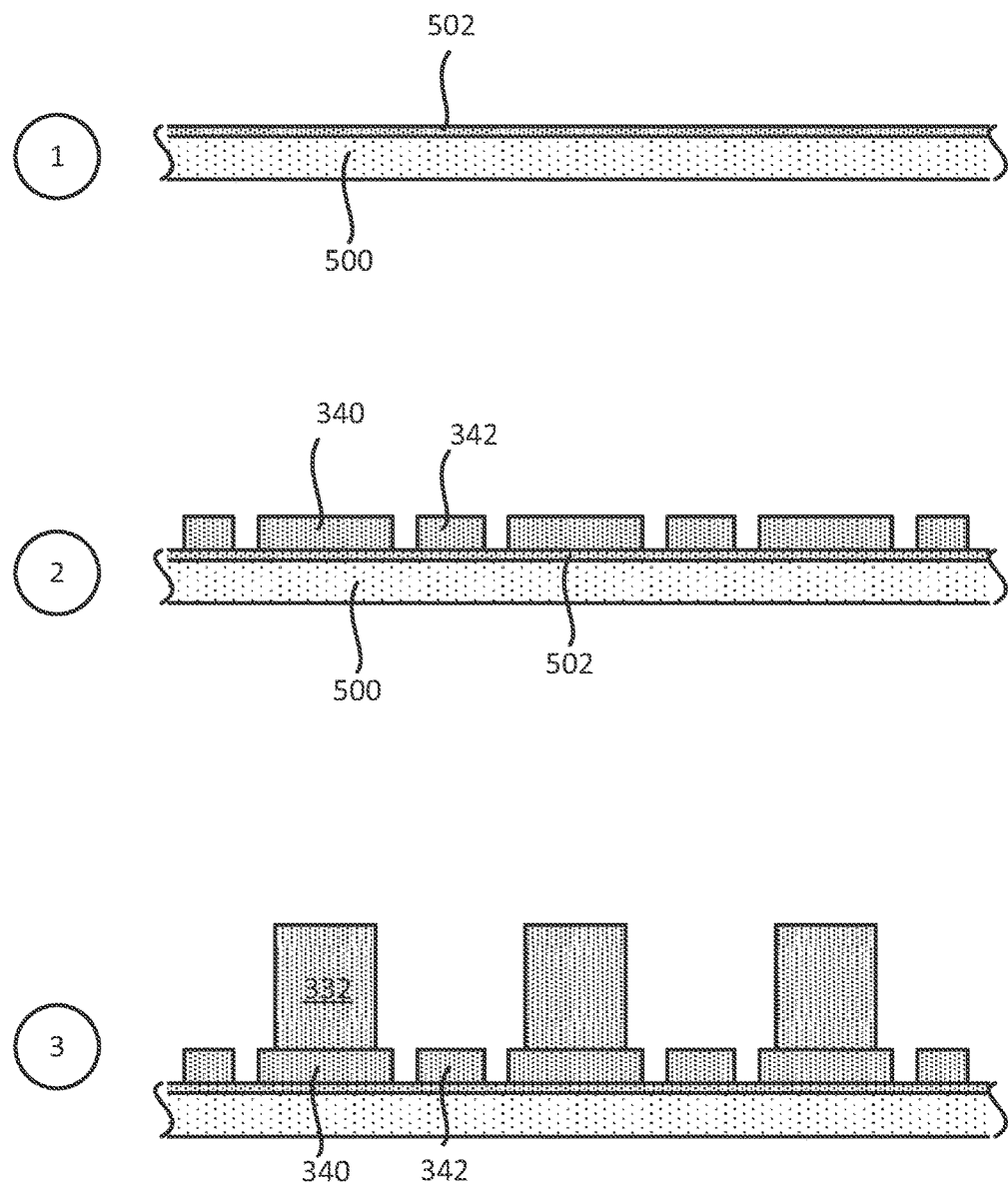
FIG. 5 (comprising FIGS. 5A-5D) illustrates an exemplary sequence for fabricating an integrated circuit (IC) package that includes a semiconductor die, a package substrate that includes stacked vias, and an encapsulation layer.

Stage 1, as shown in FIG. 5A, illustrates a state after a carrier 500 is provided. Different implementations may provide different materials for the carrier 500. The carrier 500 may be a substrate. Stage 1 also illustrates a metal layer 502 over the carrier 500. The metal layer 502 may be a metal foil (e.g., copper foil).

Stage 2 illustrates a state after the first pad 340 and the first interconnect 342 is formed over the metal layer 502. In some implementations, a plating and patterning process is used to form the first pad 340 and the first interconnect 342. Other interconnects may also be formed. In some implementations, the first pad 340 and the first interconnect 342 are part of the first metal layer (M1) of a package substrate.

Stage 3 illustrates a state after the first via 332 is formed over the first pad 340. In some implementations, a plating process is used to form the first via 332. The first via 332 has first shape.

Figure 5B:
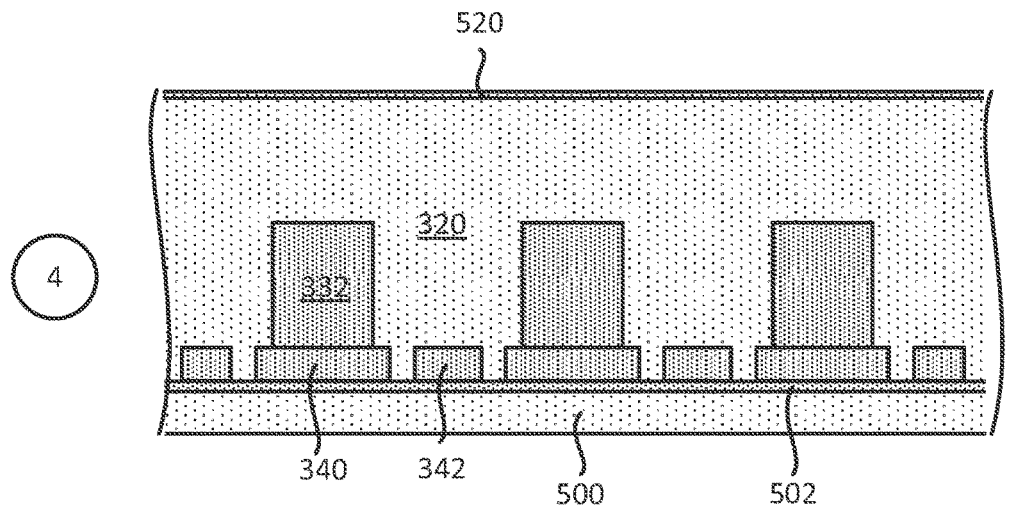
Figure 5B:
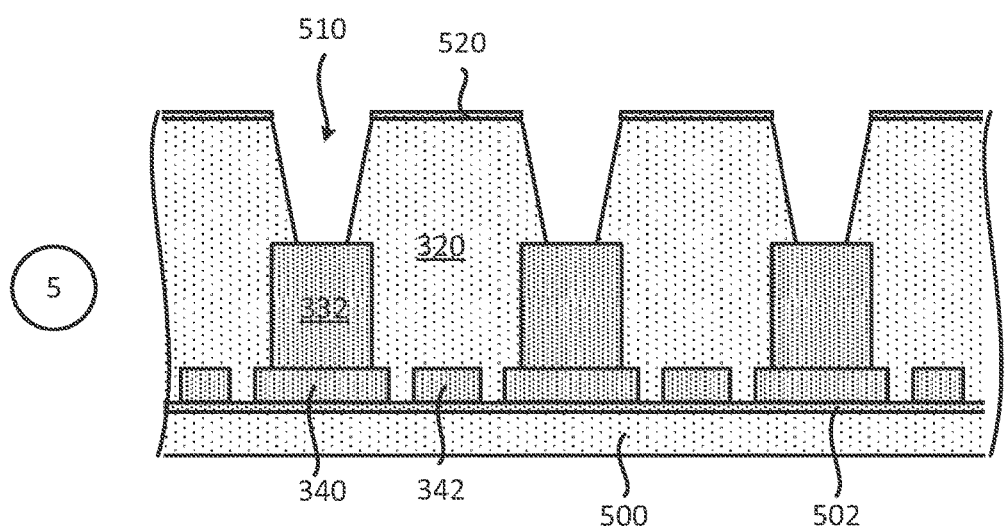

Stage 4, as shown in FIG. 5B, illustrates a state after at least one dielectric layer 320 is formed over the carrier 500, the metal layer 502, the first pad 340, the first interconnect 342 and/or the first via 332. Different implementations may provide the at least one dielectric layer 320 differently. In some implementations, the at least one dielectric layer 320 include multiple dielectric layers. The at least one dielectric layer 320 may include one or more prepreg layers. Stage 4 illustrates a metal layer 520 that is formed over the at least one dielectric layer 320. The metal layer 520 may be a seed layer.

Stage 5 illustrates a state after at least one cavity 510 that is formed in the at least one dielectric layer 320 over the first pad 332. In some implementations, a laser process (e.g., laser ablation) is used to form one or more cavities in the at least one dielectric layer 320. The process may create a cavity through the metal layer 520.

Figure 5C:
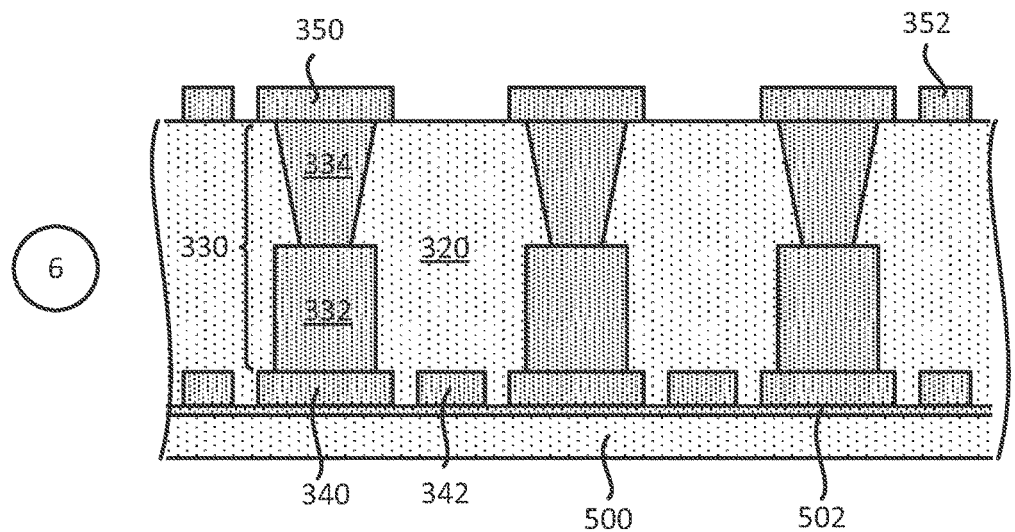
Figure 5C:
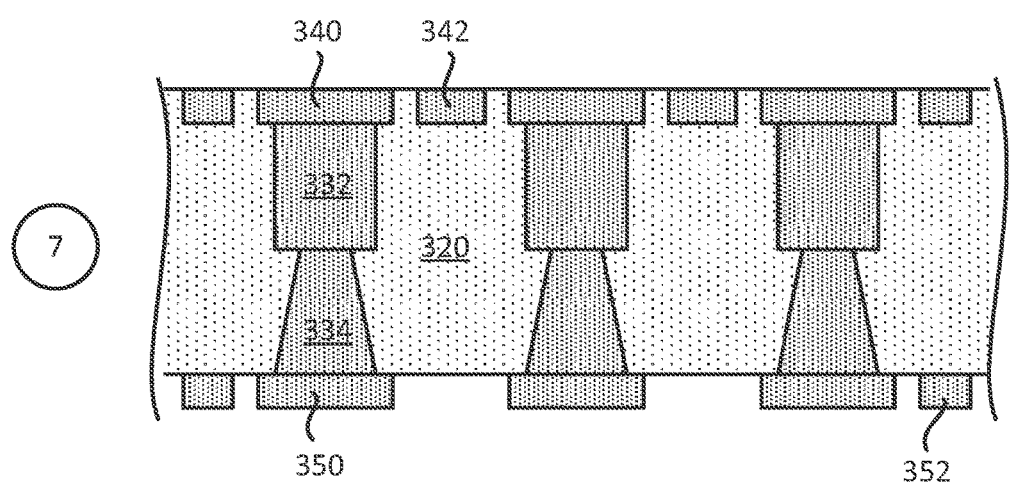

Stage 6, as shown in FIG. 5C, illustrates a state after the second via 334 is formed over the first via 332 such that the second via 334 is coupled to the first via 332. Stage 6 also illustrates a state after the second pad 350 and the at least one interconnect 352 are formed over the at least one dielectric layer 320 and/or the second via 334. Stage 6 illustrates the at least one stacked via 330 formed by the first via 332 and the second via 334. Different implementations may form the second via 334, the second pad 350 and/or the second interconnect 352 using different processes. In some implementations, the second via 334, the second pad 350 and/or the second interconnect 352 are formed using a plating process. In some implementations, the second pad 350 and the second interconnect 352 are part of the second metal layer (M2) of the package substrate. The second pad 350 and/or the second interconnect 352 may include the metal layer 520. In some implementations, the metal layer 520 is a seed layer.

Stage 7 illustrates a state after the carrier 500 is removed. Stage 7 may also illustrates a state after the metal layer 502 is removed.

Figure 5D:
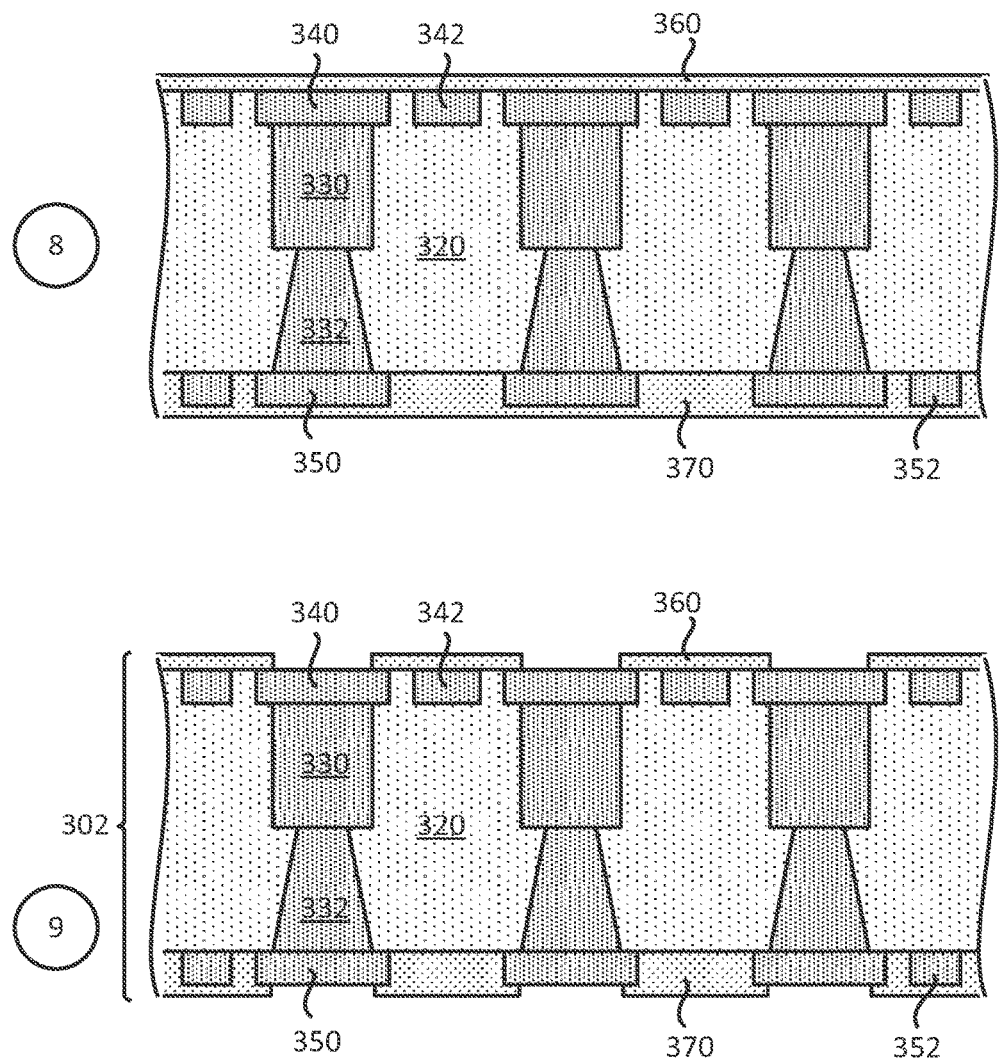

Stage 8, as shown in FIG. 5D, illustrates a state after the first solder resist (SR) layer 560 is formed over a first surface of the package substrate, and the second solder resist (SR) layer 570 is formed over a second surface of the package substrate. The first solder resist (SR) layer 560 is formed over the first pad 340, the first interconnect 342 and the dielectric layer 320. The second solder resist (SR) layer 570 is formed over the second pad 350, the second interconnect 352 and the dielectric layer 320.

Stage 9 illustrates a state after portions of the first solder resist (SR) layer 560 and portions of the second solder resist (SR) layer 570 are removed. In some implementations, the first solder resist (SR) layer 560 and he second solder resist (SR) layer 570 may be selectively formed, instead of portions being removed. In some implementations, stage 9 illustrates a state of the package substrate 302 of FIG. 3 In some implementations, FIGS. 5A-5D illustrate a sequence of a process for fabricating a package substrate that includes stacked vias and/or interconnects with dimensions as described in FIGS. 3 and 4.

Figure 6:
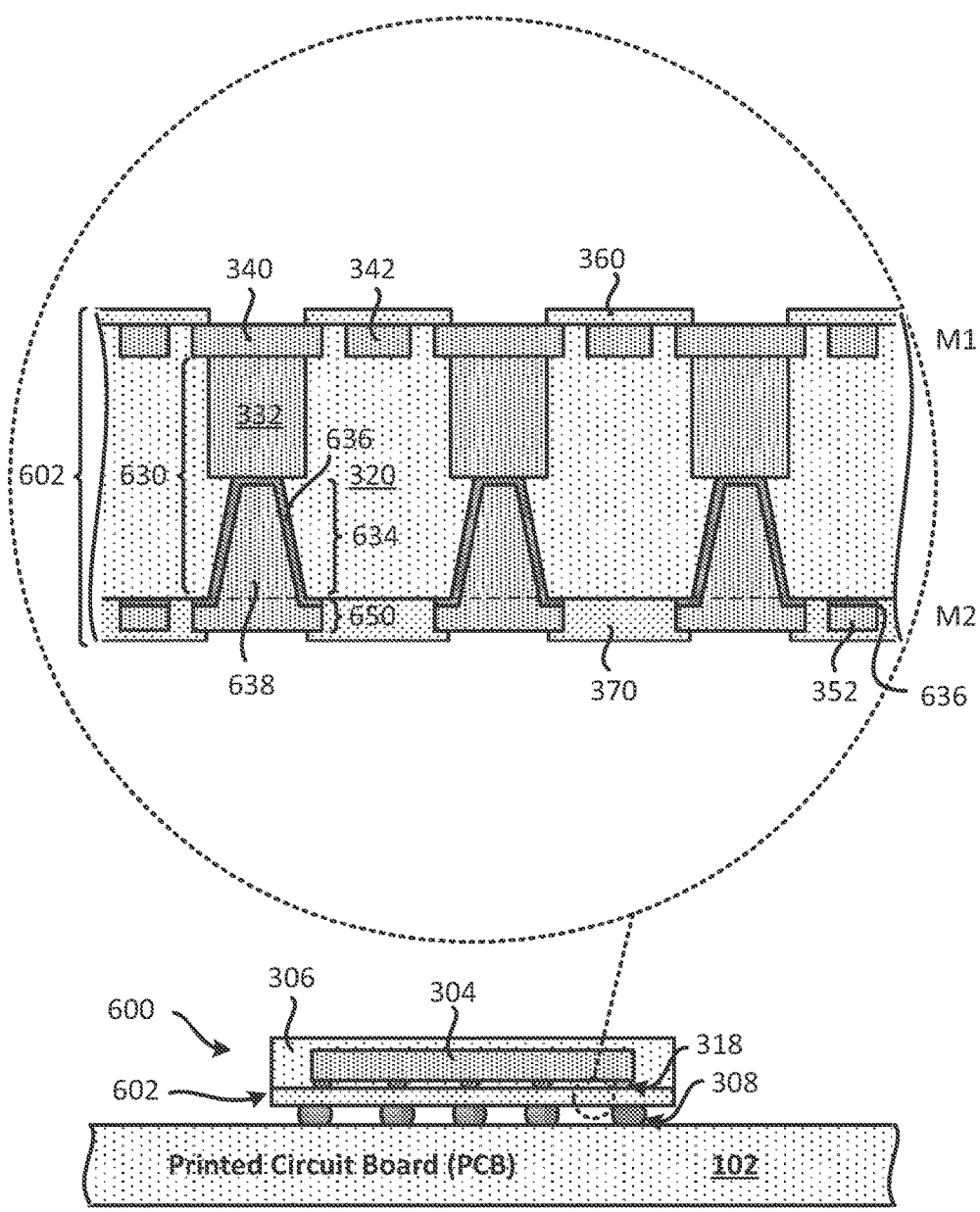
FIG. 6 illustrates an integrated circuit (IC) package that includes a semiconductor die, a package substrate that includes stacked vias with a seed layer, and an encapsulation layer.

Exemplary Integrated Circuit (IC) Package Comprising a Package Substrate that Includes Stacked Vias FIG. 6 illustrates an integrated circuit (IC) package 600 coupled to a printed circuit board (PCB) 102 through a plurality of solder interconnects 308. The integrated circuit (IC) package 600 includes a package substrate 602, a die 304 (e.g., semiconductor die), and an encapsulation layer 306. The die 304 is coupled to the package substrate 602 through a plurality of interconnects 318. The encapsulation layer 306 at least partially encapsulates the die 304. In some implementations, the package substrate 602 is a more detailed illustration of the package substrate 302 of FIG. 3. In some implementations, the second via 634 may be a more detailed representation of the second via 334 of FIG. 3.

The package substrate 602 includes at least one stacked via that includes a first via and a second via coupled to the first via. The first via has a first shape and the second via has a second shape. The second via has a different shape than the first via.

As shown in FIG. 3, the package substrate 602 includes at least one dielectric layer 220, at least one stacked via 630, a first pad 340, at least one first interconnect 342, a second pad 650, at least one second interconnect 352, a first solder resist (SR) layer 360 and a second solder resist (SR) layer 370.

The at least one stacked via 630 travels through the at least one dielectric layer 220. A means for interconnect may include the at least one stacked via 630. The at least one stacked via 630 includes a first via 332 and a second via 634. The first via 332 is coupled to the second via 634 to form the at least one stacked via 630. The first via 332 is touching the second via 634. The first via 332 has a different profile shape than a profile shape of the second via 634. In this particular example, the first via 332 has a first profile shape (e.g., vertical profile shape) that is the shape of about a rectangle or about a square, and the second via 634 has a second profile shape (e.g., vertical profile shape) that is the shape of about a cone. However, different implementations may use vias with different profile shapes (e.g., different vertical profile shapes).

The first via 332 has a first surface and a second surface. The second via 634 has a third surface and a fourth surface. The second surface of the first via 332 is coupled to the third surface of the second via 634. The first surface of the first via 332 is coupled to the first pad 340. The fourth surface of the second via 634 is coupled to the second pad 650. The first pad 340 is at least partially embedded in the dielectric layer 320. The second pad 650 is formed over the dielectric layer 320. In some implementations, the first via 332 is formed such that the first via 332 is free of a seed layer (e.g., the first via 332 does not include a seed layer).

As mentioned above, in some implementations, the second via 634 may be a more detailed representation of the second via 334 of FIG. 3. As shown in FIG. 6, the second via 634 includes a seed layer 636 and a metal layer 638. The seed layer 636 is located at the interface of the first via 332 and the second via 634. The seed layer 636 is coupled to the first via 332 and the metal layer 638. The seed layer 636 is located between the first via 332 and the metal layer 638. The seed layer 636 is also located on the side walls of the second via 634. As mentioned above, in some implementations, the first via 332 is formed such that the first via 332 is free of a seed layer (e.g., the first via 332 does not include a seed layer). In such instances, the seed layer 626 of the second via 634 is not in contact (e.g., free of contact) with another seed layer at the interface of the first via 332. In some implementations, the first via 332 may not include a seed layer, however, the first via 332 may be coupled to a seed layer of another interconnect (e.g., second via 334).

FIG. 6 also illustrates that the second pad 650 include the metal layer 638. Thus, in some implementations, the second via 634 and the second pad 650 share a metal layer and/or metal material. In some implementations, the second via 634 and the second pad 650 include a contiguous region of a metal layer. In some implementations, the second pad 650 is a representation of the second pad 350 of FIG. 3.

As mentioned above, the package substrate 602 includes at least one first interconnect 342 and at least one second interconnect 352. The at least one first interconnect 342 may include a trace and/or a pad. The at least one second interconnect 352 may include a trace and/or a pad. The at least one first interconnect 342 is at least partially embedded in the dielectric layer 320. The at least one second interconnect 352 is formed over the dielectric layer 320. The at least one first interconnect 342 is substantially co-planar to the first pad 340. In some implementations, the at least one first interconnect 342 and the first pad 340 are on a first metal layer (M1) of the package substrate 602. The at least one second interconnect 352 is substantially co-planar to the second pad 650. In some implementations, the at least one second interconnect 352 and the second pad 650 are on a second metal layer (M2) of the package substrate 602. The at least one second interconnect 352 may include the seed layer 636. The seed layer 636 may be formed over the dielectric layer 320. The seed layer 636 may be different, similar or the same as the seed layer 636 coupled to the second via 634.

The first solder resist (SR) layer 360 may cover portions of a first surface of the package substrate 602. For example, the first solder resist (SR) layer 360 may cover the dielectric layer 320, the at least one first interconnect 342 and/or portions of the first pad 340. The second solder resist (SR) layer 370 may cover portions of a second surface of the package substrate 602. For example, the second solder resist (SR) layer 370 may cover the dielectric layer 320, the at least one second interconnect 352 and/or portions of the second pad 650. Different implementations may use different materials for the at least one dielectric layer 320. In some implementations, the at least one dielectric layer 320 includes a prepreg layer.

FIG. 6 illustrates that a first surface of the package substrate 602 faces the die 304, and a second surface of the package substrate 602 faces the printed circuit board (PCB) 102. In some implementations, one or more of the interconnects from the plurality of interconnects 318 is coupled to interconnects (e.g., first pad 340) from the M1 layer. The plurality of interconnects 318 may include pillars and/or solder interconnects. In some implementations, one or more of the interconnects from the plurality of solder interconnects 308 is coupled to interconnects (e.g., second pad 650) from the M2 layer.

In some implementations, the package substrate of an integrated circuit (IC) package may be configured differently.

Figure 7:
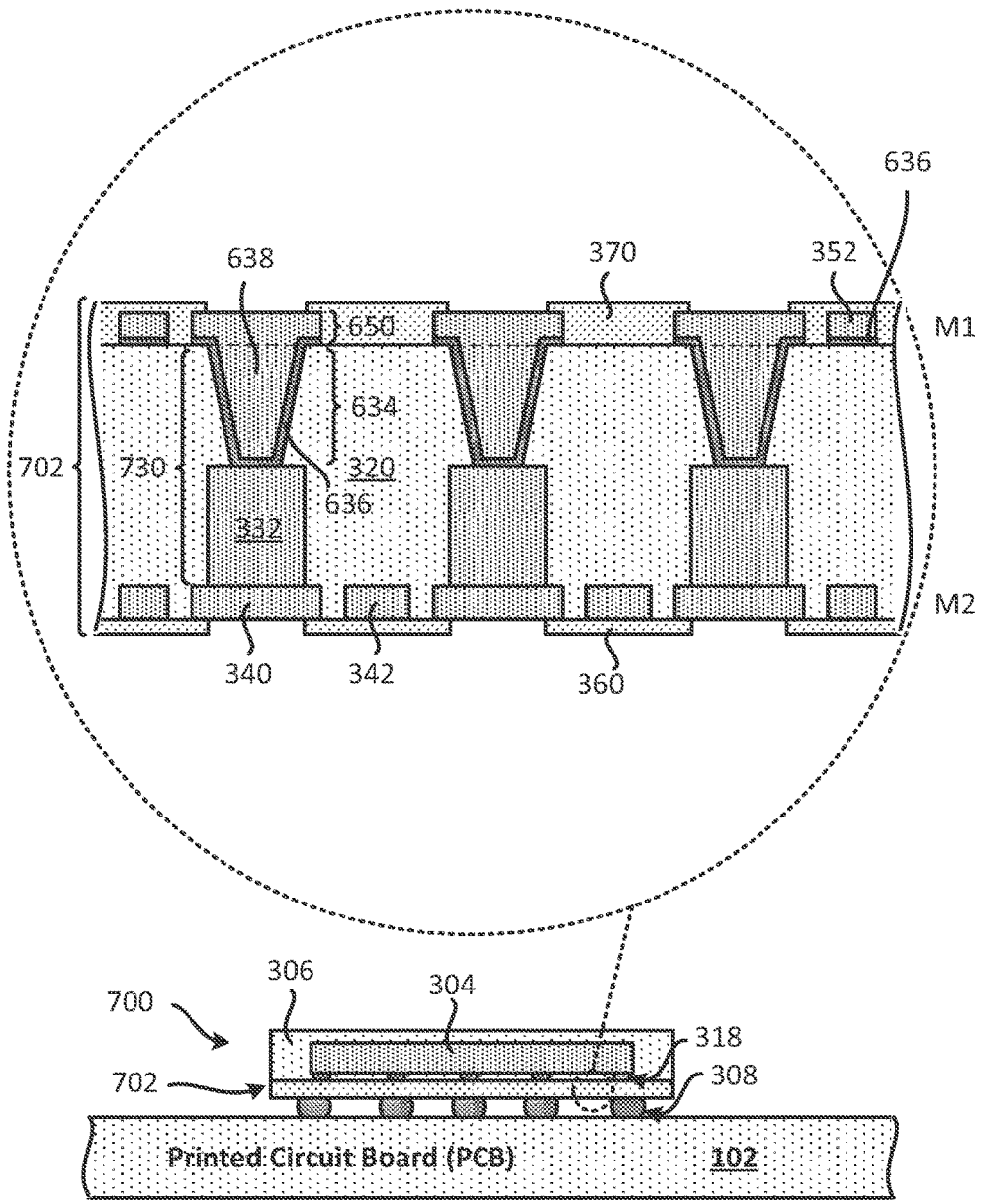
FIG. 7 illustrates an integrated circuit (IC) package that includes a semiconductor die, a package substrate that includes stacked vias with a seed layer, and an encapsulation layer.

FIG. 7 illustrates an integrated circuit (IC) package 700 coupled to the printed circuit board (PCB) 102 through the plurality of solder interconnects 408. The integrated circuit (IC) package 700 includes a package substrate 702, the die 304 (e.g., semiconductor die), and the encapsulation layer 306. The die 304 is coupled to the package substrate 702 through the plurality of interconnects 318. The encapsulation layer 306 at least partially encapsulates the die 304. In some implementations, the package substrate 702 is a more detailed illustration of the package substrate 402 of FIG. 4.

The package substrate 702 includes at least one stacked via that includes a first via and a second via coupled to the first via. The first via has a first shape and the second via has a second shape. The second via has a different shape than the first via.

The package substrate 702 of FIG. 7 is similar to the package substrate 602 of FIG. 3. The package substrate 702 includes at least one stacked via 430. The at least one stacked via 430 travels through the at least one dielectric layer 220. The at least one stacked via 430 includes the first via 332 and the second via 634. The first via 332 is coupled to the second via 634 to form the at least one stacked via 430. The first via 332 is touching the second via 634. The first via 332 has a different profile shape than a profile shape of the second via 634. In this particular example, the first via 332 has a first profile shape (e.g., vertical profile shape) that is the shape of about a rectangle or about a square, and the second via 634 has a second profile shape (e.g., vertical profile shape) that is the shape of about a cone. However, different implementations may use vias with different profile shapes (e.g., different vertical profile shapes).

In some implementations, the second via 634 may be a more detailed representation of the second via 334 of FIG. 4. As shown in FIG. 7, the second via 634 includes the seed layer 636 and the metal layer 638. The seed layer 636 is located at the interface of the first via 332 and the second via 634. The seed layer 636 is coupled to the first via 332 and the metal layer 638. The seed layer 636 is located between the first via 332 and the metal layer 638. The seed layer 636 is also located on the side walls of the second via 634. FIG. 7 also illustrates that the second pad 650 include the metal layer 638. Thus, in some implementations, the second via 634 and the second pad 650 share a metal layer and/or metal material. In some implementations, the second via 634 and the second pad 650 include a contiguous region of a metal layer. In some implementations, the second pad 650 is a representation of the second pad 350 of FIG. 4.

In some implementations, the second pad 650 and the at least one second interconnect 352 are considered part of the first metal layer (M1) of the package substrate 702, and the first pad 340 and the at least one first interconnect 342 are considered part of the second metal layer (M2) of the package substrate 702. The at least one second interconnect 352 may include the seed layer 636. The seed layer 636 may be formed over the dielectric layer 320. The seed layer 636 may be different, similar or the same as the seed layer 636 coupled to the second via 634.

FIG. 7 illustrates that a first surface of the package substrate 702 faces the printed circuit board (PCB) 102, and a second surface of the package substrate 702 faces the die 304. In some implementations, one or more of the interconnects from the plurality of interconnects 318 is coupled to interconnects (e.g., second pad 650) from the M1 layer. The plurality of interconnects 318 may include pillars and/or solder interconnects. In some implementations, one or more of the interconnects from the plurality of solder interconnects 308 is coupled to interconnects (e.g., first pad 340) from the M2 layer.

One of the technical advantages of the above package substrate 602 and/or the package substrate 702 is how tightly and/or densely the interconnects (e.g., stacked vias, pads, traces) can be formed on and/or in the package substrate. For example, by using a stacked via (e.g., 630) that is formed by multiple vias (e.g., two or more vias), an overall via with a smaller width or diameter can be formed in the package substrate 602 and/or the package substrate 702. As mentioned above, other conventional package substrates produce vias with relatively large or wide widths or diameters. This is due to the limitations of the fabrication processes that are used to produce these vias in conventional package substrates. In contrast, the package substrate 602 and/or the package substrate 702 may include stacked vias (e.g., at least one stacked via 630) that have a width or diameter that can be as small as about 70-80 micrometers ($\mu m$). The stacked vias may have a height of about 50-80 micrometers ($\mu m$). In some implementations, the overall thickness of the package substrate 602 and/or the package substrate 702 may be as small as about 60-100 micrometers ($\mu m$). In some implementations, the pads (e.g., first pad 340, second pad 650) may have a width that is as small as about 100-115 micrometers ($\mu m$). In some implementations, a plurality of first interconnects (e.g., 342) and/or a plurality of second interconnects (e.g., 352) may include line and spacing (L/S) in a range of about 5/5 micrometers ($\mu m$) and about 12/12 micrometers ($\mu m$). That is, the line (L) of interconnects may be about 5-12 micrometers ($\mu m$), and the spacing of interconnects may be about 5-12 micrometers ($\mu m$). The line (L) of an interconnect may be referred to as the width of the interconnect, and the spacing (S) of an interconnect may be referred to as a spacing between two adjacent interconnects. In some implementations, the above dimensions are made possible through the fabrication processes that are described in the present disclosure.

Figure 8:
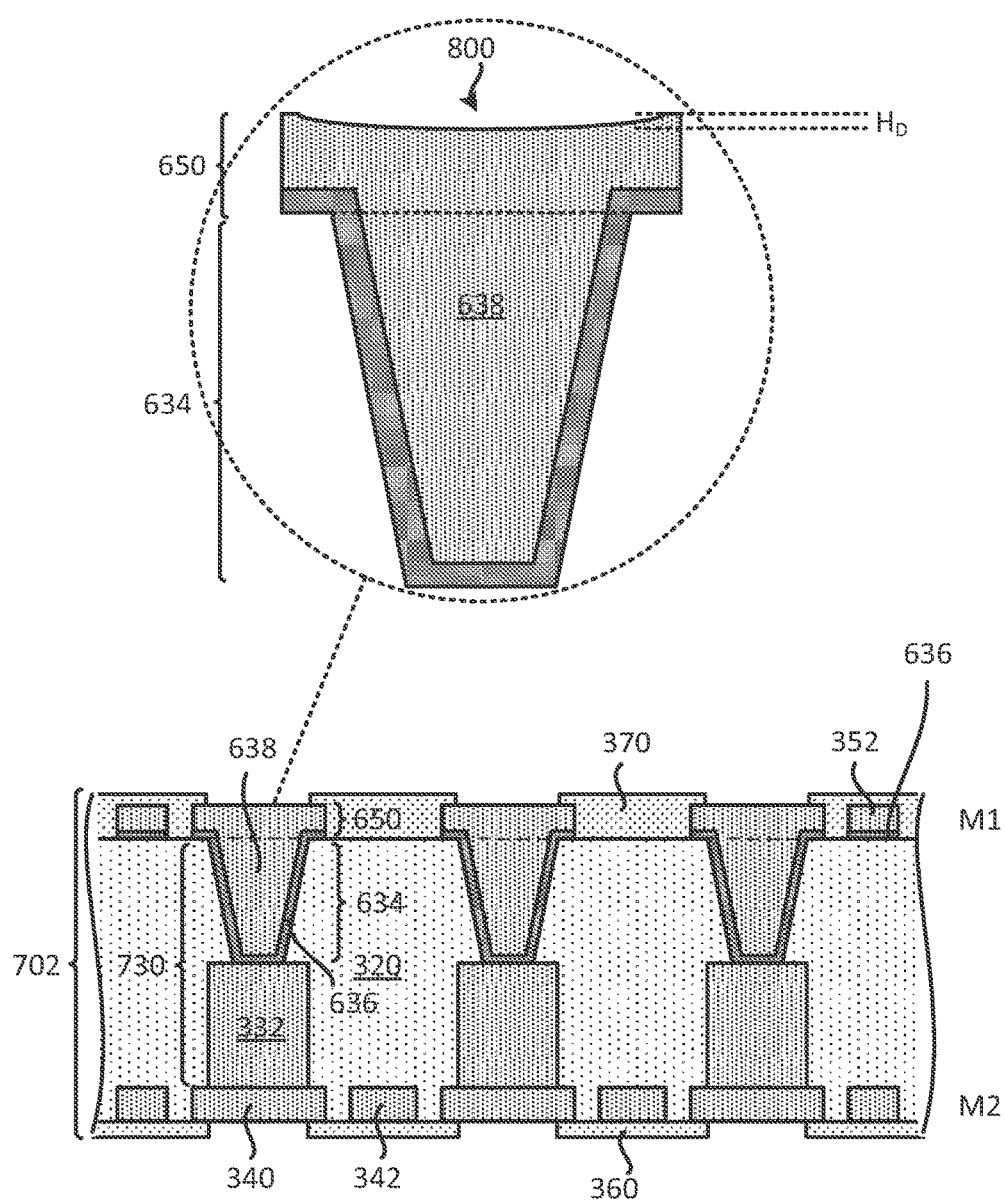
FIG. 8 illustrates a package substrate that includes stacked vias with a seed layer, and an encapsulation layer.

In some implementations, one or more of the pads (e.g., 350, 650) may include a dimple and/or a curved surface. FIG. 8 illustrates a close up view of a via (e.g., 634) and a pad (e.g., 650) of a package substrate (e.g., 702). As shown in FIG. 8, the surface of the second pad 650 is curved or has a dimple 800. The dimple 800 or curvature of the surface of the second pad 650 can be expressed as the height ($H_D$) of the dimple 800. In some implementations, the height ($H_D$) of the dimple 800 can be quantified as the difference between the lowest point of the surface of the second pad 650 and the highest point of the surface of the second pad 650. In some implementations, the height ($H_D$) of the dimple of a pad (e.g., 350, 650) can be about 1-10 micrometers (μm).

Exemplary Sequence for Fabricating a Package Substrate that Includes Stacked Vias with a Seed Layer In some implementations, fabricating a package substrate that includes stacked vias includes several processes. FIG. 9 (which includes FIGS. 9A-9D) illustrates an exemplary sequence for providing or fabricating a package substrate that includes stacked vias. In some implementations, the sequence of FIGS. 9A-9D may be used to provide or fabricate the package substrate of FIGS. 3, 4, 6, 7 and/or other package substrate described in the present disclosure. However, FIGS. 9A-9D will be described in the context of fabricating the package substrate 602 of FIG. 6.

It should be noted that the sequence of FIGS. 9A-9D may combine one or more stages in order to simplify and/or clarify the sequence for providing or fabricating a package substrate that includes stacked vias. In some implementations, the order of the processes may be changed or modified. In some implementations, one or more of processes may be replaced or substituted with departing from the spirit of the disclosure.

Figure 9A:
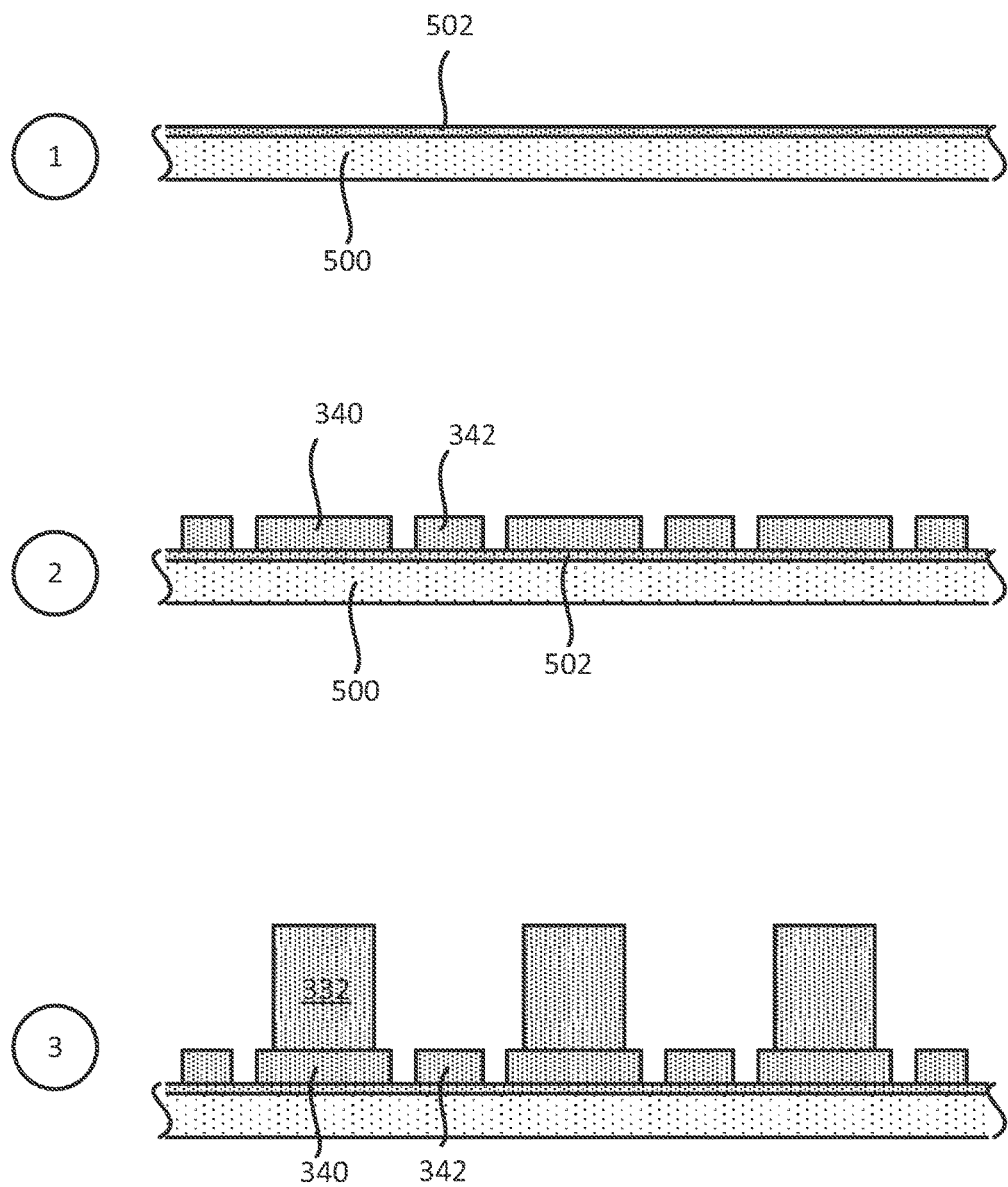
FIG. 9 (comprising FIGS. 9A-9D) illustrates an exemplary sequence for fabricating an integrated circuit (IC) package that includes a semiconductor die, a package substrate that includes stacked vias with a seed layer, and an encapsulation layer.

Stage 1, as shown in FIG. 9A, illustrates a state after a carrier 500 is provided. Different implementations may provide different materials for the carrier 500. The carrier 500 may be a substrate. Stage 1 also illustrates a metal layer 502 over the carrier 500. The metal layer 502 may be a metal foil (e.g., copper foil).

Stage 2 illustrates a state after the first pad 340 and the first interconnect 342 is formed over the metal layer 502. In some implementations, a plating and patterning process is used to form the first pad 340 and the first interconnect 342. Other interconnects may also be formed. In some implementations, the first pad 340 and the first interconnect 342 are part of the first metal layer (M1) of a package substrate.

Stage 3 illustrates a state after the first via 332 is formed over the first pad 340. In some implementations, a plating process is used to form the first via 332. The first via 332 has first shape.

Figure 9B:
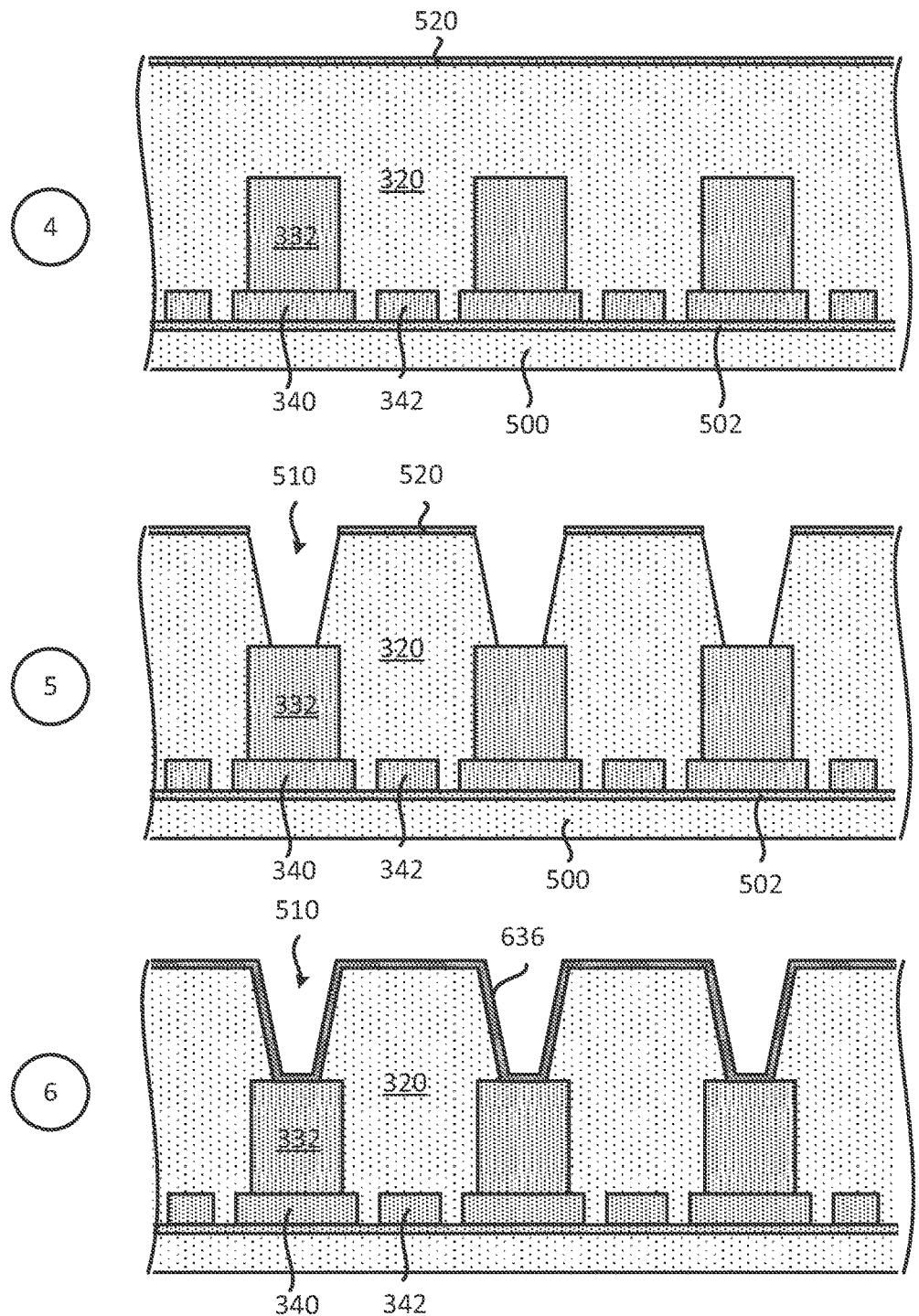

Stage 4, as shown in FIG. 9B, illustrates a state after at least one dielectric layer 320 is formed over the carrier 500, the metal layer 502, the first pad 340, the first interconnect 342 and/or the first via 332. Different implementations may provide the at least one dielectric layer 320 differently. In some implementations, the at least one dielectric layer 320 include multiple dielectric layers. The at least one dielectric layer 320 may include one or more prepreg layers. Stage 4 illustrates a metal layer 520 that is formed over the at least one dielectric layer 320.

Stage 5 illustrates a state after at least one cavity 510 that is formed in the at least one dielectric layer 320 over the first pad 332. In some implementations, a laser process (e.g., laser ablation) is used to form one or more cavities in the at least one dielectric layer 320. The process may create a cavity through the metal layer 520.

Stage 6 illustrates a state after a seed layer 636 is formed in the at least one cavity 510. The seed layer 636 may be similar or the same as the metal layer 520. In some implementations, the seed layer 636 may be formed over the metal layer 520. In some implementations, the metal layer 520 may be removed before the seed layer 636 is formed. In the example of Stage 6, the metal layer 520 has been removed before the seed layer 626 has been formed.

Figure 9C:
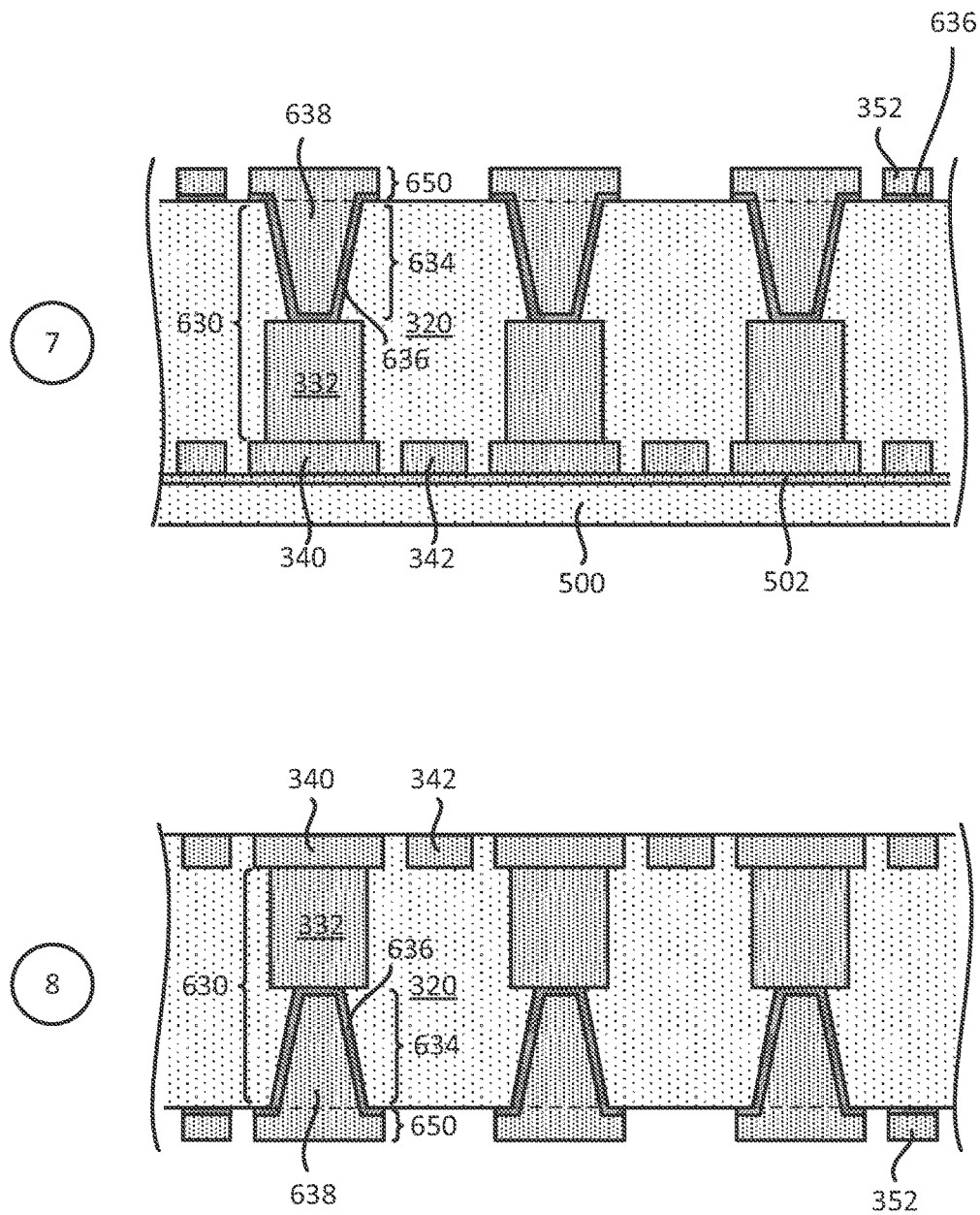

Stage 7, as shown in FIG. 9C, illustrates a state after the second via 634 is formed over the first via 332 such that the second via 634 is coupled to the first via 632. A metal layer 638 is formed over the seed layer 636. The second via 634 is formed by the seed layer 636 and the metal layer 638. Stage 7 also illustrates a state after the second pad 650 and the at least one interconnect 352 are formed over the at least one dielectric layer 320 and/or the second via 634. In some implementations, forming the metal layer 638 forms both the second via 634 and the second pad 650. Stage 7 illustrates the at least one stacked via 630 formed by the first via 332 and the second via 634. Different implementations may form the second via 634, the second pad 650 and/or the second interconnect 352 using different processes. In some implementations, the second via 334, the second pad 350 and/or the second interconnect 352 are formed using a plating process. In some implementations, the second pad 350 and the second interconnect 352 are part of the second metal layer (M2) of the package substrate. The at least one second interconnect 352 may include the seed layer 636. The seed layer 636 may be different similar, or the same as the seed layer 636 coupled to the second via 634.

Stage 8 illustrates a state after the carrier 500 is removed. Stage 8 may also illustrates a state after the metal layer 502 is removed.

Figure 9D:
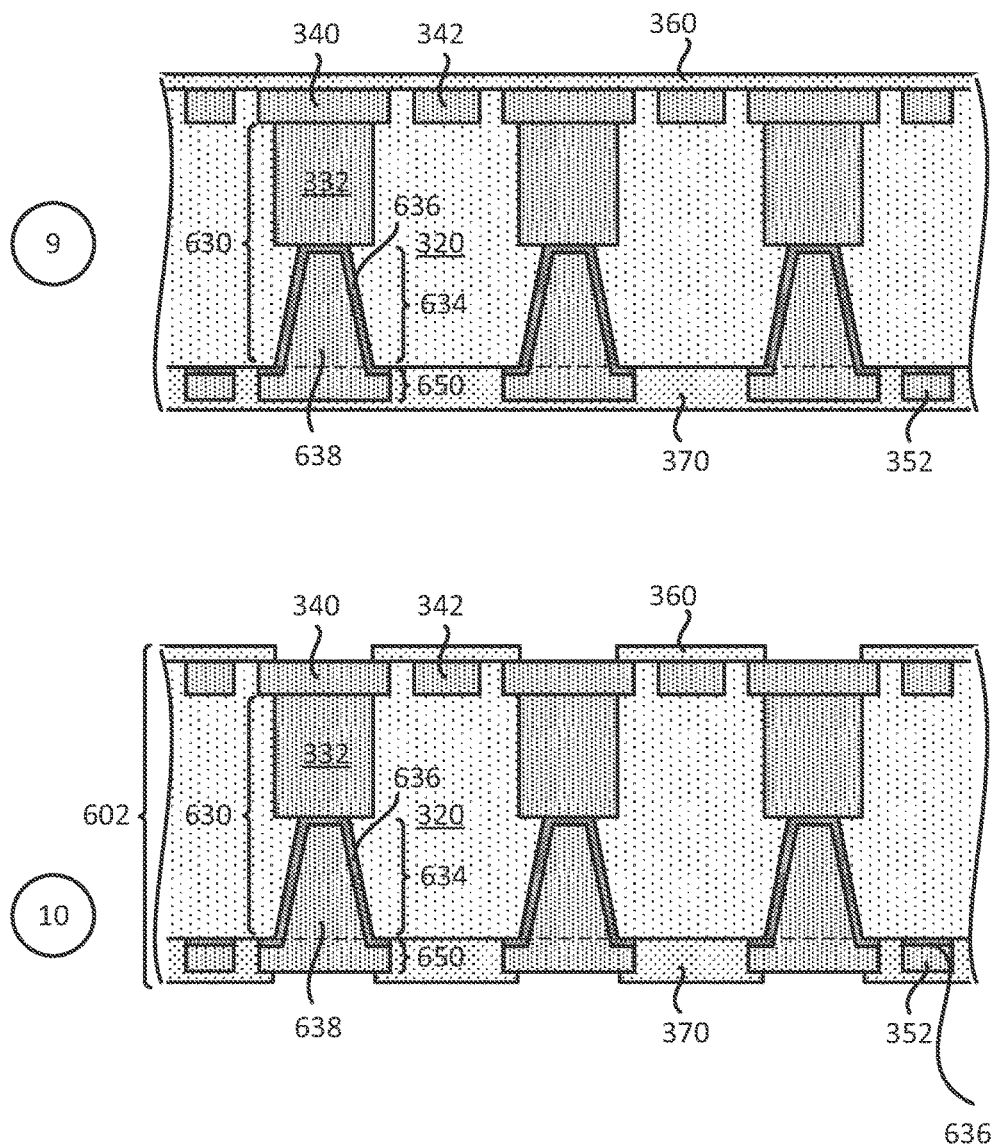

Stage 9, as shown in FIG. 9D, illustrates a state after the first solder resist (SR) layer 560 is formed over a first surface of the package substrate, and the second solder resist (SR) layer 570 is formed over a second surface of the package substrate. The first solder resist (SR) layer 560 is formed over the first pad 340, the first interconnect 342 and the dielectric layer 320. The second solder resist (SR) layer 570 is formed over the second pad 650, the second interconnect 352 and the dielectric layer 320.

Stage 10 illustrates a state after portions of the first solder resist (SR) layer 560 and portions of the second solder resist (SR) layer 570 are removed. In some implementations, the first solder resist (SR) layer 560 and he second solder resist (SR) layer 570 may be selectively formed, instead of portions being removed. In some implementations, stage 10 illustrates a state of the package substrate 602 of FIG. 6 In some implementations, FIGS. 9A-9D illustrate a sequence of a process for fabricating a package substrate that includes stacked vias and/or interconnects with dimensions as described in FIGS. 3, 4, 6 and 7.

Figure 10:
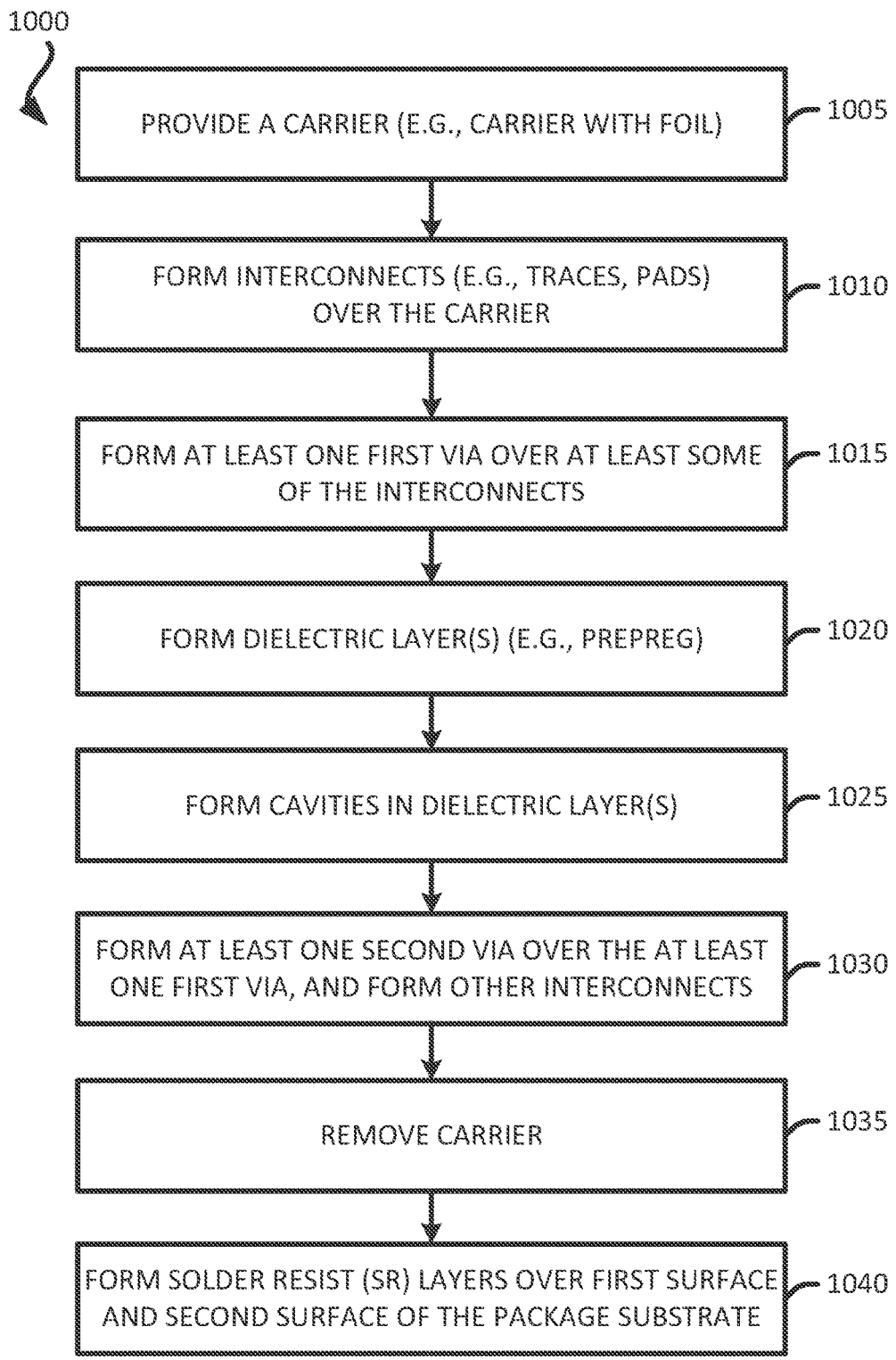
FIG. 10 illustrates an exemplary flow diagram of a method for fabricating a package substrate that includes stacked vias.

Exemplary Flow Diagram of a Method for Fabricating a Package Substrate that Includes Stacked Vias In some implementations, providing a package substrate that includes stacked vias includes several processes. FIG. 10 illustrates an exemplary flow diagram of a method 1000 for providing or fabricating a package substrate that includes stacked vias. In some implementations, the method 1000 of FIG. 10 may be used to provide or fabricate the package substrate of FIGS. 3, 4 and/or other package substrates described in the present disclosure.

It should be noted that the sequence of FIG. 10 may combine one or more processes in order to simplify and/or clarify the method for providing or fabricating a package substrate that includes stacked vias. In some implementations, the order of the processes may be changed or modified.

The method provides (at 1005) a carrier (e.g., carrier 500). Different implementations may provide different materials for the carrier. The carrier may be a substrate. In some implementations, a metal layer (e.g., 502) may also be provided with the carrier. The metal layer may be a metal foil (e.g., copper foil).

The method forms (at 1010) interconnects over the carrier and/or the metal layer. Examples of interconnects includes the first pad 340 and the first interconnect 342. A plating and patterning process may be used to form the interconnects. In some implementations, the interconnects are part of a first metal layer (M1) of the package substrate.

The method forms (at 1015) at least one first via over the interconnects. The first via may include the first via 332. A plating process may be used to form the first via. However, different implementations may use different processes for forming the first via.

The method forms (at 1020) at least one dielectric layer (e.g., 320) over the carrier (e.g., 500), the metal layer (e.g., 502), the first pad (e.g., 340), the first interconnect (e.g., 342) and/or the first via (e.g., 332). Different implementations may provide the at least one dielectric layer differently. In some implementations, the at least one dielectric layer 320 include multiple dielectric layers. The at least one dielectric layer 320 may include one or more prepreg layers. The method may also form a metal layer (e.g., 520) over the at least one dielectric layer. The metal layer (e.g., 520) may be a seed layer.

The method forms (at 1025) at least one cavity (e.g., 510) in the at least one dielectric layer. In some implementations, a laser process (e.g., laser ablation) is used to form one or more cavities in the at least one dielectric layer. In some implementations, the process may create a cavity through the metal layer 520.

The method forms (at 1030) a second via (e.g., 334) over the first via such that the second via is coupled to the first via. The second via may be formed in the cavity of the dielectric layer. In some implementations, forming the second via may include forming a seed layer (e.g., 636). In some implementations, forming the second via may include using a plating process (e.g., electroless copper plating process). The method may also form other interconnects over the dielectric layer, such as the second pad 350 and the at least one second interconnect 352. The combination of the first via (e.g., 332) and the second via (e.g., 334) form the stacked vias of a package substrate. Different implementations may form the second via 334, the second pad 350 and/or the second interconnect 352 using different processes. In some implementations, the second via 334, the second pad 350 and/or the second interconnect 352 are formed using a plating process. In some implementations, the second pad 350 and the second interconnect 352 are part of the second metal layer (M2) of the package substrate.

The method removes (at 1035) the carrier. In some implementations, removing the carrier (e.g., 500) includes removing a metal layer (e.g., 502).

The method forms (at 1040) solder resist (SR) layers over a first and second surface of the package substrate. For example, the method may form a first solder resist (SR) layer 560 over a first surface of the package substrate, and form a second solder resist (SR) layer 570 over a second surface of the package substrate. In some implementations, forming the solder resist (SR) layers may include selectively removing some solder resist (SR) layers.

It is also noted that the sequence of FIG. 10 may be used to fabricate (e.g., concurrently fabricate) several package substrates on a wafer. The wafer is then singulated (e.g., cut) into individual package substrates. These singulated package substrates may then be coupled to dies and/or printed circuit boards (PCBs).

Figure 11:
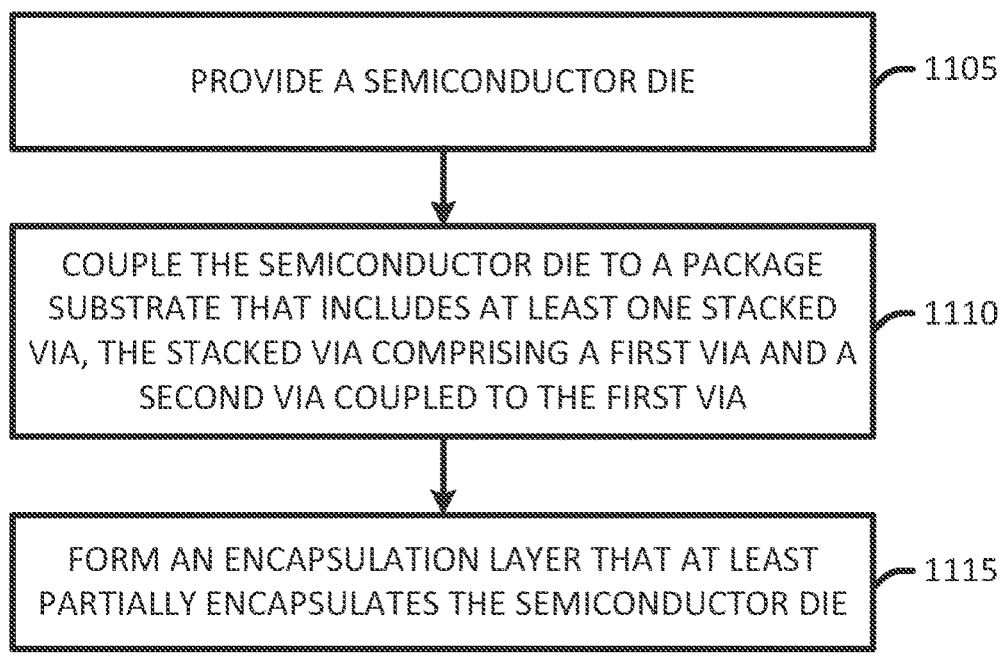
FIG. 11 illustrates an exemplary flow diagram of a method for fabricating an integrated circuit (IC) package that includes a semiconductor die, a package substrate that includes stacked vias, and an encapsulation layer.

Exemplary Flow Diagram of a Method for Fabricating an Integrated Circuit (IC) Package Comprising a Package Substrate that Includes Stacked Vias In some implementations, providing an integrated circuit (IC) package that includes a package substrate comprising stacked vias includes several processes. FIG. 11 illustrates an exemplary flow diagram of a method 1100 for providing or fabricating an integrated circuit (IC) package that includes a package substrate comprising stacked vias. In some implementations, the method 1100 of FIG. 11 may be used to provide or fabricate the integrated circuit (IC) package of FIGS. 3, 4 and/or other integrated circuit (IC) package described in the present disclosure.

It should be noted that the sequence of FIG. 11 may combine one or more processes in order to simplify and/or clarify the method for providing or fabricating an integrated circuit (IC) package that includes a package substrate comprising stacked vias. In some implementations, the order of the processes may be changed or modified.

The method provides (at 1105) a die (e.g., die 304).

The method couples (at 1110) the die to a package substrate (e.g., 302, 402) that includes stacked vias, where a stacked via (e.g., 330, 430) is formed by a first via (e.g., 332) and a second via (e.g., 334). Examples of package substrates are shown in FIG. 3 and FIG. 4. FIGS. 5A-5D and FIG. 6 illustrate examples of how a package substrate may be fabricated.

The method forms (at 1115) an encapsulation layer (e.g., 306) over the die. The encapsulation layer is formed such that the encapsulation layer at least partially encapsulates the die. The encapsulation layer may be formed over the package substrate.

It is also noted that the sequence of FIG. 11 may be used to fabricate (e.g., concurrently fabricate) several integrated circuit (IC) packages on a wafer. The wafer is then singulated (e.g., cut) into individual packages. These singulated packages may then be coupled to printed circuit boards (PCBs).

Exemplary Semi-Additive Patterning (SAP) Process

Various interconnects (e.g., traces, vias, pads) are described in the present disclosure. These interconnects may be formed in a die, a package substrate, an encapsulation layer and/or an encapsulation portion. In some implementations, these interconnects may include one or more metal layers. For example, in some implementations, these interconnects may include a first metal seed layer and a second metal layer. The metal layers may be provided (e.g., formed) using different plating processes. Below are detailed examples of interconnects (e.g., traces, vias, pads) with seed layers and how these interconnects may be formed using different plating processes. These plating processes are described to form interconnects in and/or on a dielectric layer. In some implementations, these plating processes may be used to form interconnects in and/or on an encapsulation layer.

Different implementations may use different processes to form and/or fabricate the metal layers (e.g., interconnects, redistribution layer, under bump metallization layer,). In some implementations, these processes include a semi-additive patterning (SAP) process and a damascene process. These various different processes are further described below.

Figure 12:
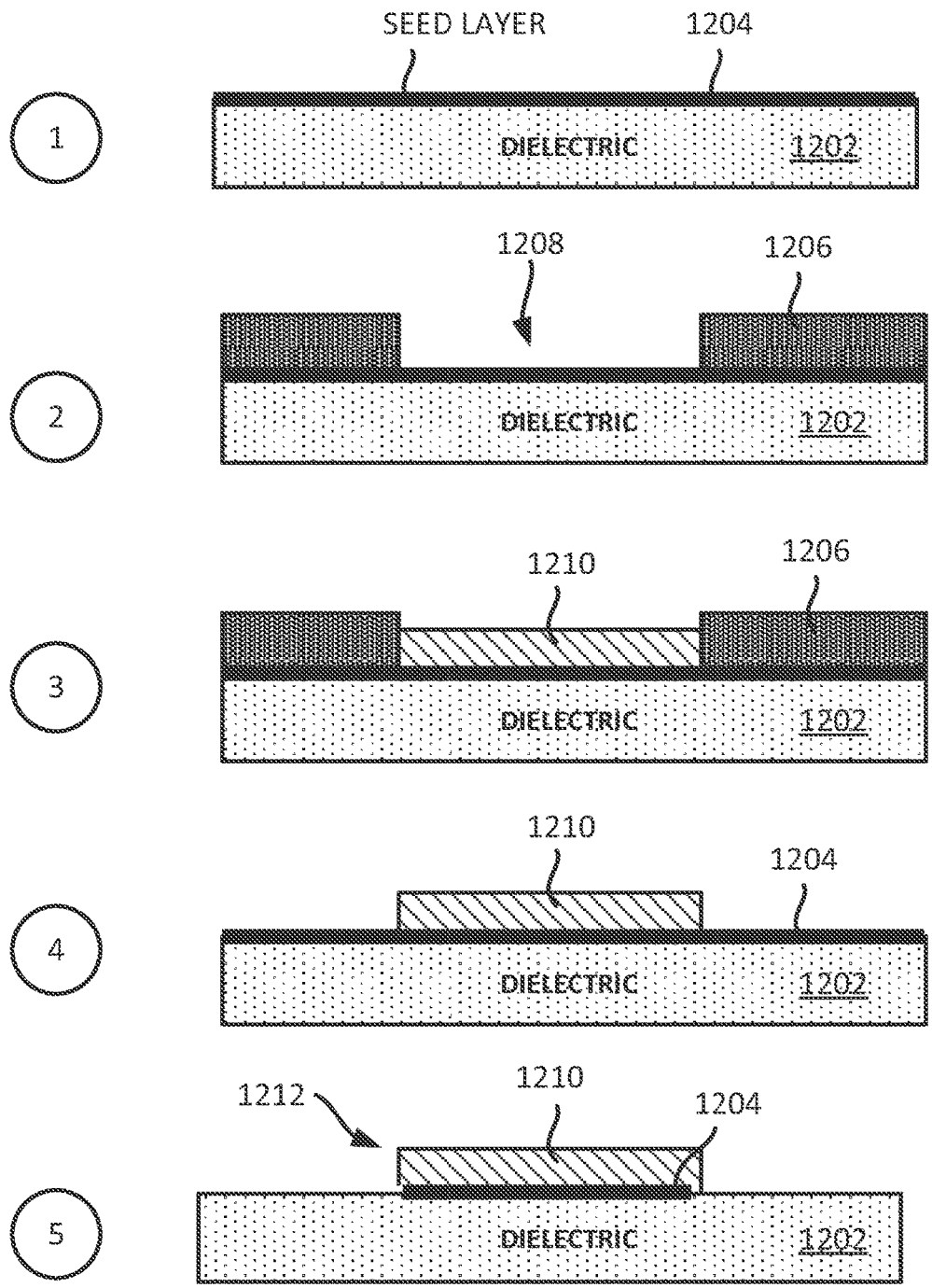
FIG. 12 illustrates an exemplary sequence of a semi-Additive Patterning (SAP) process.

FIG. 12 illustrates a sequence for forming an interconnect using a semi-additive patterning (SAP) process to provide and/or form an interconnect in one or more dielectric layer(s). As shown in FIG. 12, stage 1 illustrates a state of an integrated device (e.g., substrate) after a dielectric layer 1202 is provided (e.g., formed). In some implementations, stage 1 illustrates that the dielectric layer 1202 includes a first metal layer 1204. The first metal layer 1204 is a seed layer in some implementations. In some implementations, the first metal layer 1204 may be provided (e.g., formed) on the dielectric layer 1202 after the dielectric layer 1202 is provided (e.g., received or formed). Stage 1 illustrates that the first metal layer 1204 is provided (e.g., formed) on a first surface of the dielectric layer 1202. In some implementations, the first metal layer 1204 is provided by using a deposition process (e.g., PVD, CVD, plating process).

Stage 2 illustrates a state of the integrated device after a photo resist layer 1206 (e.g., photo develop resist layer) is selectively provided (e.g., formed) on the first metal layer 1204. In some implementations, selectively providing the photo resist layer 1206 includes providing a photo resist layer 1206 on the first metal layer 1204 and selectively removing portions of the photo resist layer 1206 by developing (e.g., using a development process). Stage 2 illustrates that the photo resist layer 1206 is provided such that a cavity 1208 is formed.

Stage 3 illustrates a state of the integrated device after a second metal layer 1210 is formed in the cavity 1208. In some implementations, the second metal layer 1210 is formed over an exposed portion of the first metal layer 1204. In some implementations, the second metal layer 1210 is provided by using a deposition process (e.g., plating process).

Stage 4 illustrates a state of the integrated device after the photo resist layer 1206 is removed. Different implementations may use different processes for removing the photo resist layer 1206.

Stage 5 illustrates a state of the integrated device after portions of the first metal layer 1204 are selectively removed. In some implementations, one or more portions of the first metal layer 1204 that is not covered by the second metal layer 1210 is removed. As shown in stage 5, the remaining first metal layer 1204 and the second metal layer 1210 may form and/or define an interconnect 1212 (e.g., trace, vias, pads) in an integrated device and/or a substrate. In some implementations, the first metal layer 1204 is removed such that a dimension (e.g., length, width) of the first metal layer 1204 underneath the second metal layer 1210 is about the same or smaller than a dimension (e.g., length, width) of the second metal layer 1210, which can result in an undercut, as shown at stage 5 of FIG. 12. In some implementations, the above mentioned processes may be iterated several times to provide and/or form several interconnects in one or more dielectric layers of an integrated device and/or a substrate.

Figure 13:
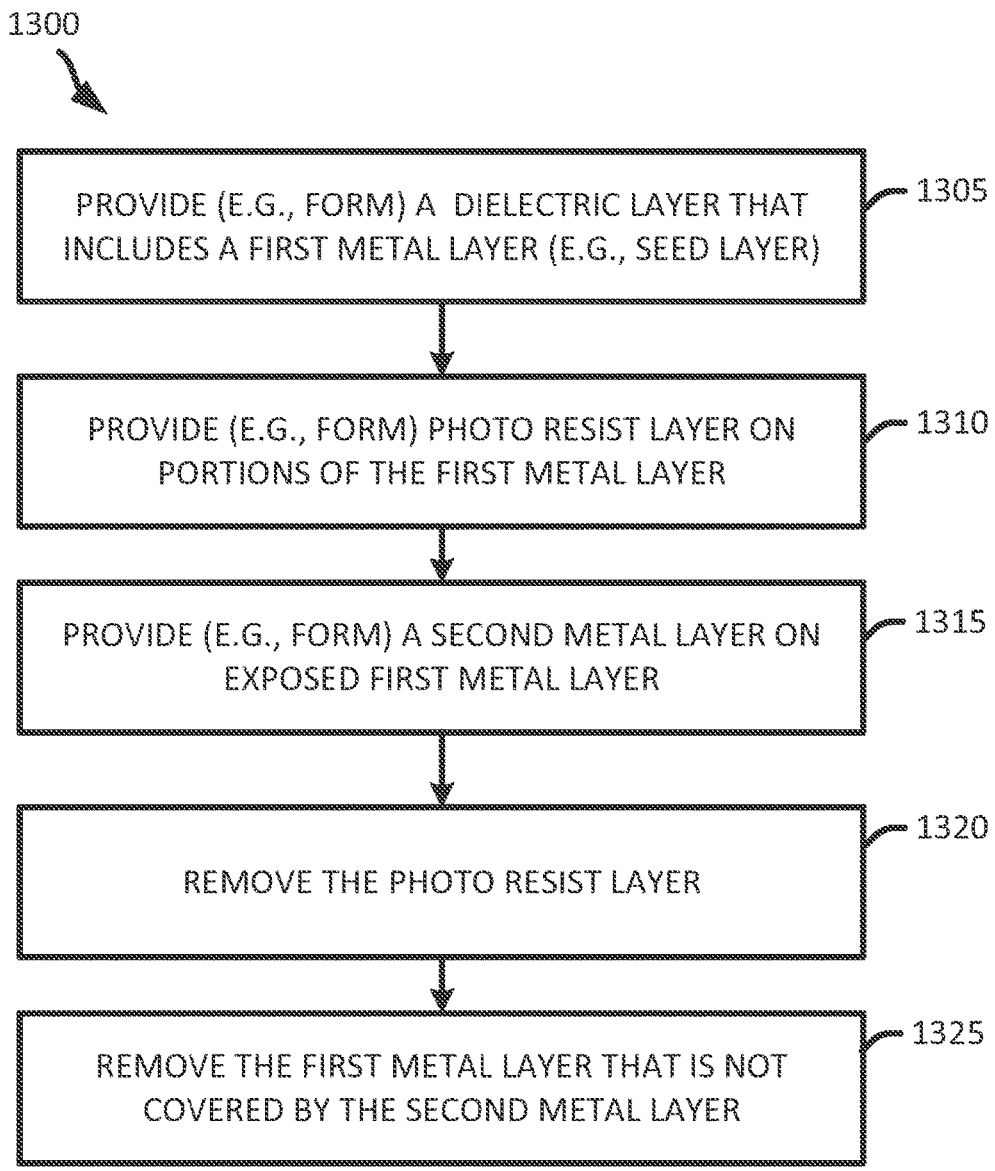
FIG. 13 illustrates an exemplary flow diagram of a semi-Additive Patterning (SAP) process.

FIG. 13 illustrates a flow diagram for a method for using a (SAP) process to provide and/or form an interconnect in one or more dielectric layer(s). The method provides (at 1305) a dielectric layer (e.g., dielectric layer 1202). In some implementations, providing the dielectric layer includes forming the dielectric layer. In some implementations, providing the dielectric layer includes forming a first metal layer (e.g., first metal layer 1204). The first metal layer is a seed layer in some implementations. In some implementations, the first metal layer may be provided (e.g., formed) on the dielectric layer after the dielectric layer is provided (e.g., received or formed). In some implementations, the first metal layer is provided by using a deposition process (e.g., physical vapor deposition (PVD) or plating process).

The method selectively provides (at 1310) a photo resist layer (e.g., a photo develop resist layer 1206) on the first metal layer. In some implementations, selectively providing the photo resist layer includes providing a photo resist layer on the first metal layer and selectively removing portions of the photo resist layer (which provides one or more cavities).

The method then provides (at 1315) a second metal layer (e.g., second metal layer 1210) in the cavity of the photo resist layer. In some implementations, the second metal layer is formed over an exposed portion of the first metal layer. In some implementations, the second metal layer is provided by using a deposition process (e.g., plating process).

The method further removes (at 1320) the photo resist layer. Different implementations may use different processes for removing the photo resist layer. The method also selectively removes (at 1325) portions of the first metal layer. In some implementations, one or more portions of the first metal layer that is not covered by the second metal layer are removed. In some implementations, any remaining first metal layer and second metal layer may form and/or define one or more interconnects (e.g., trace, vias, pads) in an integrated device and/or a substrate. In some implementations, the above mentioned method may be iterated several times to provide and/or form several interconnects in one or more dielectric layers of an integrated device and/or substrate.

Exemplary Damascene Process

Figure 14:
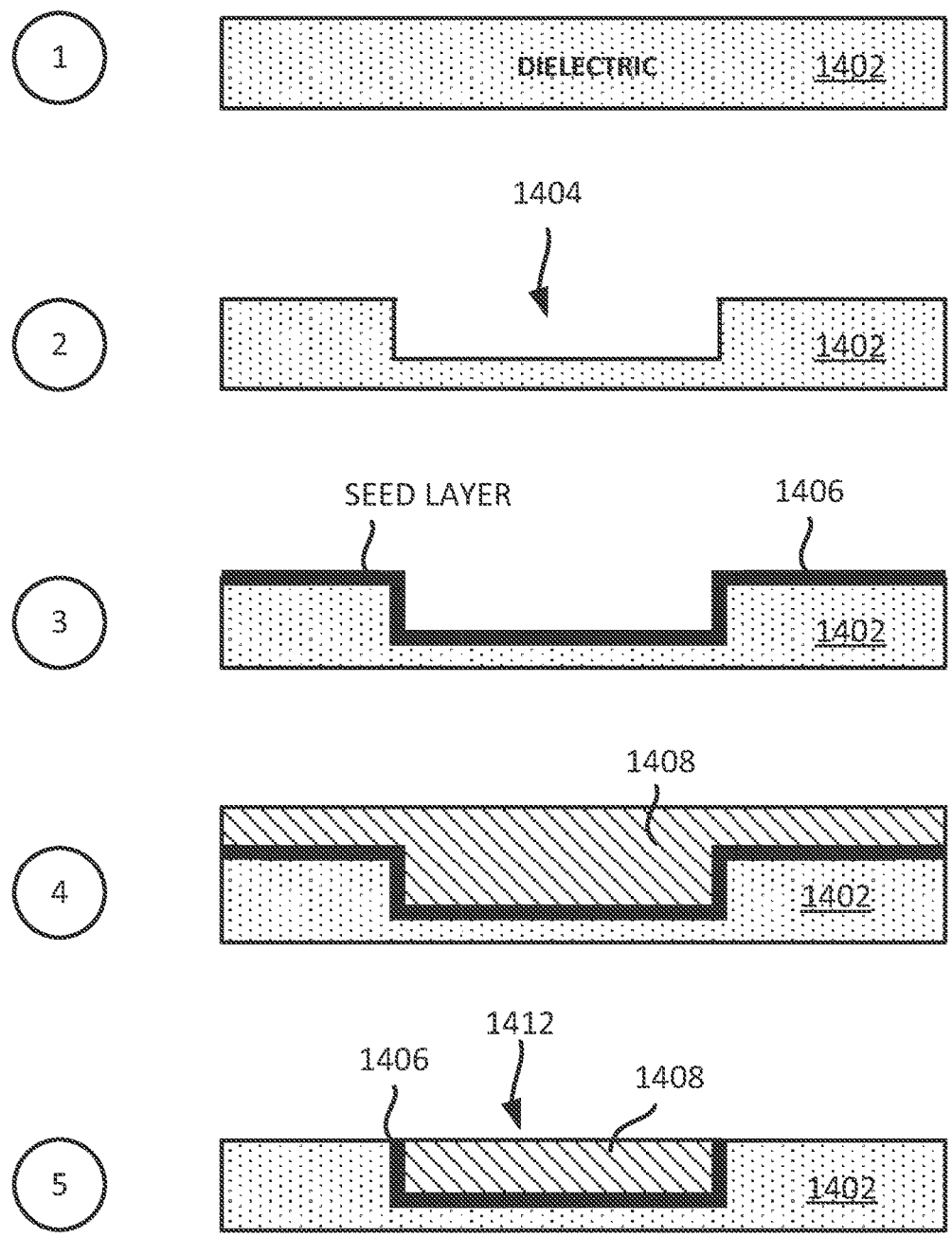
FIG. 14 illustrates an exemplary sequence of a damascene process.

FIG. 14 illustrates a sequence for forming an interconnect using a damascene process to provide and/or form an interconnect in a dielectric layer. As shown in FIG. 14, stage 1 illustrates a state of an integrated device after a dielectric layer 1402 is provided (e.g., formed). In some implementations, the dielectric layer 1402 is an inorganic layer (e.g., inorganic film).

Stage 2 illustrates a state of an integrated device after a cavity 1404 is formed in the dielectric layer 1402. Different implementations may use different processes for providing the cavity 1404 in the dielectric layer 1402.

Stage 3 illustrates a state of an integrated device after a first metal layer 1406 is provided on the dielectric layer 1402. As shown in stage 3, the first metal layer 1406 provided on a first surface of the dielectric layer 1402. The first metal layer 1406 is provided on the dielectric layer 1402 such that the first metal layer 1406 takes the contour of the dielectric layer 1402 including the contour of the cavity 1404. The first metal layer 1406 is a seed layer in some implementations. In some implementations, the first metal layer 1406 is provided by using a deposition process (e.g., physical vapor deposition (PVD), Chemical Vapor Deposition (CVD) or plating process).

Stage 4 illustrates a state of the integrated device after a second metal layer 1408 is formed in the cavity 1404 and a surface of the dielectric layer 1402. In some implementations, the second metal layer 1408 is formed over an exposed portion of the first metal layer 1406. In some implementations, the second metal layer 1408 is provided by using a deposition process (e.g., plating process).

Stage 5 illustrates a state of the integrated device after the portions of the second metal layer 1408 and portions of the first metal layer 1406 are removed. Different implementations may use different processes for removing the second metal layer 1408 and the first metal layer 1406. In some implementations, a chemical mechanical planarization (CMP) process is used to remove portions of the second metal layer 1408 and portions of the first metal layer 1406. As shown in stage 5, the remaining first metal layer 1406 and the second metal layer 1408 may form and/or define an interconnect 1412 (e.g., trace, vias, pads) in an integrated device and/or a substrate. As shown in stage 5, the interconnect 1412 is formed in such a way that the first metal layer 1406 is formed on the base portion and the side portion(s) of the second metal layer 1408. In some implementations, the cavity 1404 may include a combination of trenches and/or holes in two levels of dielectrics so that via and interconnects (e.g., metal traces) may be formed in a single deposition step. In some implementations, the above mentioned processes may be iterated several times to provide and/or form several interconnects in one or more dielectric layers of an integrated device and/or substrate.

Figure 15:
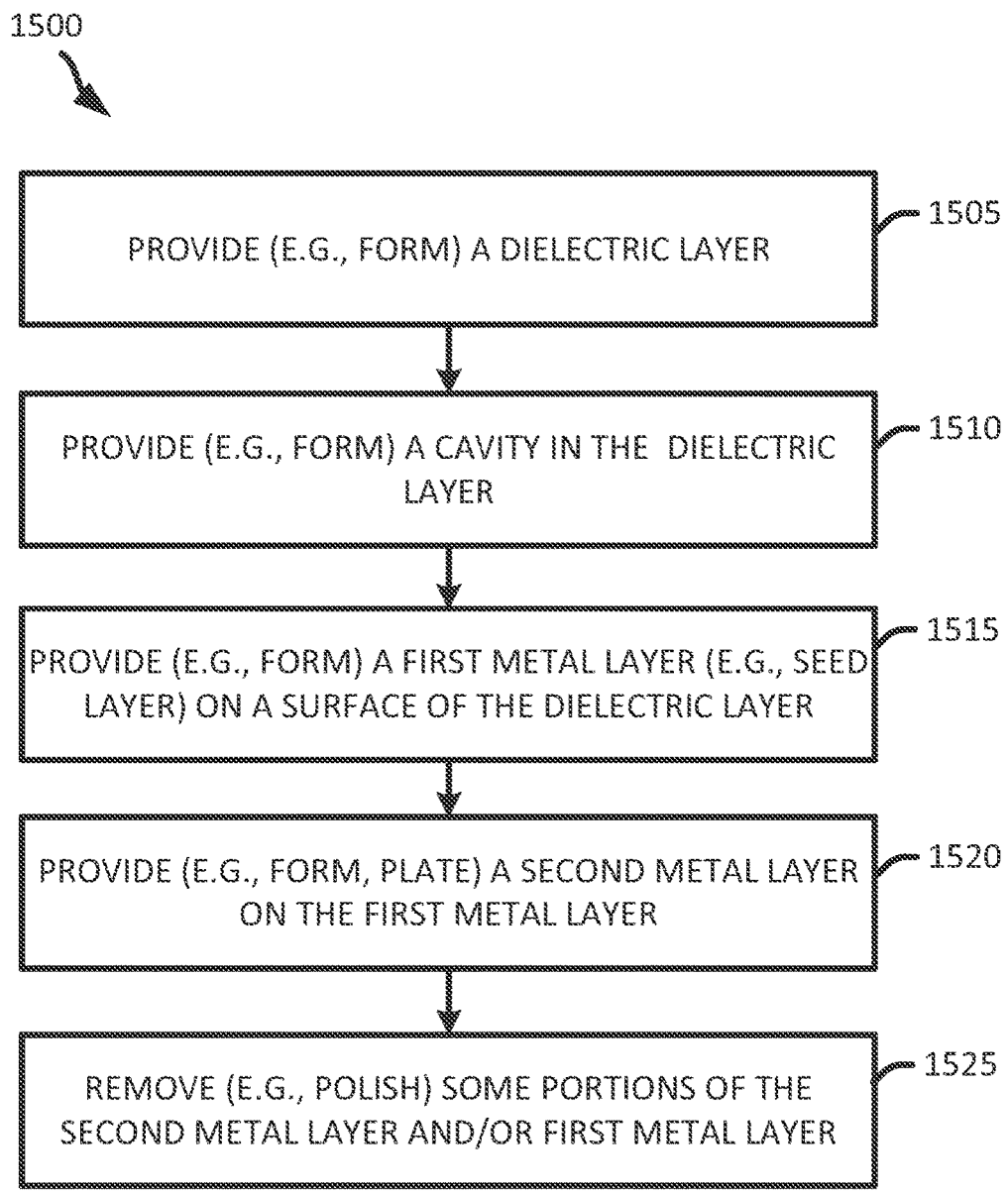
FIG. 15 illustrates an exemplary flow diagram of a damascene process.

FIG. 15 illustrates a flow diagram of a method 1500 for forming an interconnect using a damascene process to provide and/or form an interconnect in a dielectric layer. The method provides (at 1505) a dielectric layer (e.g., dielectric layer 1402). In some implementations, providing a dielectric layer includes forming a dielectric layer. In some implementations, providing a dielectric layer includes receiving a dielectric layer from a supplier. In some implementations, the dielectric layer is an inorganic layer (e.g., inorganic film).

The method forms (at 1510) at least one cavity (e.g., cavity 1404) in the dielectric layer. Different implementations may use different processes for providing the cavity in the dielectric layer.

The method provides (at 1515) a first metal layer (e.g., first metal layer 1406) on the dielectric layer. In some implementations, the first metal layer is provided (e.g., formed) on a first surface of the dielectric later. In some implementations, the first metal layer is provided on the dielectric layer such that the first metal layer takes the contour of the dielectric layer including the contour of the cavity. The first metal layer is a seed layer in some implementations. In some implementations, the first metal layer 1406 is provided by using a deposition process (e.g., PVD, CVD or plating process).

The method provides (at 1520) a second metal layer (e.g., second metal layer 1408) in the cavity and a surface of the dielectric layer. In some implementations, the second metal layer is formed over an exposed portion of the first metal layer. In some implementations, the second metal layer is provided by using a deposition process (e.g., plating process). In some implementations, the second metal layer is similar or identical to the first metal layer. In some implementations, the second metal layer is different than the first metal layer.

The method then removes (at 1525) portions of the second metal layer and portions of the first metal layer. Different implementations may use different processes for removing the second metal layer and the first metal layer. In some implementations, a chemical mechanical planarization (CMP) process is used to remove portions of the second metal layer and portions of the first metal layer. In some implementations, the remaining first metal layer and the second metal layer may form and/or define an interconnect (e.g., interconnect 1412). In some implementations, an interconnect may include a trace, a via, and/or a pad) in an integrated device and/or a substrate. In some implementations, the interconnect is formed in such a way that the first metal layer is formed on the base portion and the side portion(s) of the second metal layer. In some implementations, the above mentioned method may be iterated several times to provide and/or form several interconnects in one or more dielectric layers of an integrated device and/or substrate.

Exemplary Electronic Devices

Figure 16:
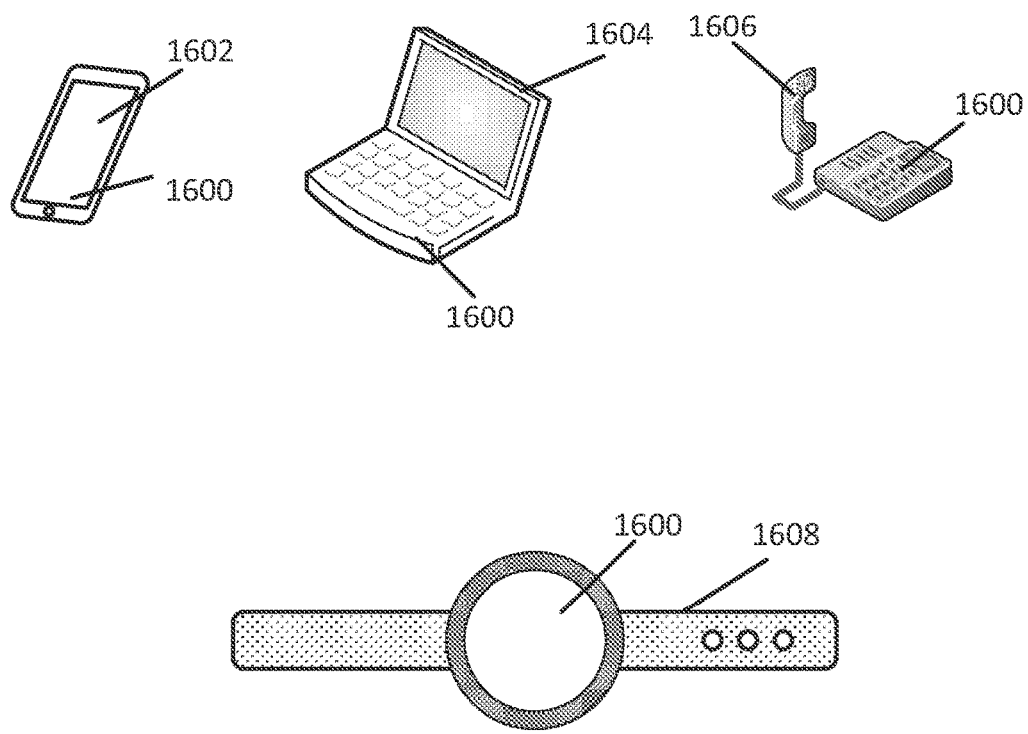
FIG. 16 illustrates various electronic devices that may integrate a die, an integrated device, a device package, a package, an integrated circuit and/or PCB described herein.

FIG. 16 illustrates various electronic devices that may be integrated with any of the aforementioned device, integrated circuit (IC) package, integrated circuit (IC) device, semiconductor device, integrated circuit, die, interposer, package or package-on-package (PoP). For example, a mobile phone device 1602, a laptop computer device 1604, a fixed location terminal device 1606, or a wearable device 1608 may include a device 1600 as described herein. The device 1600 may be, for example, any of the devices and/or integrated circuit (IC) packages described herein. The devices 1602, 1604, 1606 and 1608 illustrated in FIG. 16 are merely exemplary. Other electronic devices may also feature the device 1600 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 3-4, 5A-5D, 6-8, 9A-9D and/or 10-16 may be rearranged and/or combined into a single component, process, feature or function or embodied in several components, processes, or functions. Additional elements, components, processes, and/or functions may also be added without departing from the disclosure. It should also be noted FIGS. 3-4, 5A-5D, 6-8, 9A-9D and/or 10-16 and its corresponding description in the present disclosure is not limited to dies and/or ICs. In some implementations, FIGS. 3-4, 5A-5D, 6-8, 9A-9D and/or 10-16 and its corresponding description may be used to manufacture, create, provide, and/or produce devices and/or integrated devices. In some implementations, a device may include a die, an integrated device, a die package, an integrated circuit (IC) device, a device package, an integrated circuit (IC) package, a wafer, a semiconductor device, a package-on-package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A device comprising:
   a semiconductor die;
   a package substrate coupled to the semiconductor die, the package substrate including at least one stacked via, the at least one stacked via including:
      a first via; and
      a second via including a metal layer and a seed layer, the metal layer coupled to the seed layer, the seed layer coupled to the first via such that the seed layer is located between the first via and the metal layer of the second via, the second via including a different shape than the first via; and
   an encapsulation layer that at least partially encapsulates the semiconductor die.

2. The device of claim 1, wherein the first via and the second via are formed in a single dielectric layer.

3. The device of claim 1, wherein the package substrate further comprises:
   a first pad coupled to the first via; and
   a second pad coupled to the second via.

4. The device of claim 3, wherein the second via and the second pad are one contiguous interconnect.

5. The device of claim 3, wherein a first surface of the second pad includes a dimple.

6. The device of claim 3, wherein the first pad comprises a width in a range of about 100-115 micrometers (μm).

7. The device of claim 1, wherein the at least one stacked via comprises a width in a range of about 70-80 micrometers (μm).

8. The device of claim 1, wherein package substrate includes a plurality interconnects that comprises a line and spacing (L/S) in a range of about 5/5 micrometers (μm) and about 12/12 micrometers (μm).

9. The device of claim 1, wherein the package substrate comprises a thickness that is in a range of about 60-100 micrometers (μm), and the at least one stacked via comprises a height that is about 50-80 micrometers (μm).

10. The device of claim 1, wherein the device is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle, and further including the device.

11. The device of claim 1, wherein the first via is free of a seed layer.

12. An apparatus comprising:
   a semiconductor die;
   a package substrate coupled to the semiconductor die, the package substrate including means for interconnect, the means for interconnect including:
      a first via; and
      a second via including a metal layer and a seed layer, the metal layer coupled to the seed layer, the seed layer coupled to the first via such that the seed layer is located between the first via and the metal layer of the second via, the second via including a different shape than the first via; and
   an encapsulation layer that at least partially encapsulates the semiconductor die.

13. The apparatus of claim 12, wherein the first via and the second via are formed in a single dielectric layer.

14. The apparatus of claim 12, wherein the package substrate further comprises:
   a first pad coupled to the first via; and
   a second pad coupled to the second via.

15. The apparatus of claim 14, wherein the first pad comprises a width in a range of about 100-115 micrometers (μm).

16. The apparatus of claim 12, wherein the means for interconnect comprises a width in a range of about 70-80 micrometers (μm).

17. The apparatus of claim 12, wherein package substrate includes a plurality interconnects that comprises a line and spacing (L/S) in a range of about 5/5 micrometers (μm) and about 12/12 micrometers (μm).

18. The apparatus of claim 12, wherein the package substrate comprises a thickness that is in a range of about 60-100 micrometers (μm).

19. The apparatus of claim 12, wherein the means for interconnect comprises a height that is about 50-80 micrometers (μm).

20. The apparatus of claim 12, wherein the package substrate comprises at least one dielectric layer, and wherein the means for interconnect traverses the at least one dielectric layer.

21. The apparatus of claim 12, wherein the apparatus is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle, and further including the apparatus.

22. A method for fabricating a device, comprising:
   providing a semiconductor die;
   coupling a package substrate to the semiconductor die, the package substrate including at least one stacked via, the at least one stacked via including:
      a first via; and
      a second via including a metal layer and a seed layer, the metal layer coupled to the seed layer, the seed layer coupled to the first via such that the seed layer is located between the first via and the metal layer of the second via, the second via including a different shape than the first via; and
   forming an encapsulation layer that at least partially encapsulates the semiconductor die.

23. The method of claim 22, wherein the first via and the second via are formed in a single dielectric layer.

24. The method of claim 22, wherein the package substrate further comprises:
   a first pad coupled to the first via; and
   a second pad coupled to the second via.

25. The method of claim 24, wherein the first pad comprises a width in a range of about 100-115 micrometers (μm).

26. The method of claim 22, wherein the at least one stacked via comprises a width in a range of about 70-80 micrometers (μm).

27. The method of claim 22, wherein package substrate includes a plurality interconnects that comprises a line and spacing (L/S) in a range of about 5/5 micrometers (μm) and about 12/12 micrometers (μm).

28. The method of claim 22, wherein the package substrate comprises a thickness that is in a range of about 60-100 micrometers (μm).

29. The method of claim 22, wherein the at least one stacked via comprises a height that is about 50-80 micrometers (μm).

30. The method of claim 22, wherein the seed layer surrounds the side walls of the metal layer of second via.

31. The method of claim 22, wherein the device is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle, and further including the device.

* * * * *